United States Patent
Okhonin et al.

(10) Patent No.: US 11,251,217 B2
(45) Date of Patent: Feb. 15, 2022

(54) PHOTODETECTOR SENSOR ARRAYS

(71) Applicant: Actlight SA, Lausanne (CH)

(72) Inventors: Serguei Okhonin, St-Sulpice (CH); Maxim Gureev, Lausanne (CH); Denis Sallin, Echandens (CH)

(73) Assignee: ACTLIGHT SA, Lausanne (CH)

( * ) Notice: Subject to any disclaimer, the term of this patent is extended or adjusted under 35 U.S.C. 154(b) by 0 days.

(21) Appl. No.: 16/776,572

(22) Filed: Jan. 30, 2020

(65) Prior Publication Data

US 2020/0373346 A1    Nov. 26, 2020

Related U.S. Application Data

(63) Continuation-in-part of application No. 16/429,158, filed on Jun. 3, 2019, and a continuation-in-part of
(Continued)

(51) Int. Cl.
*H01L 31/109* (2006.01)
*H01L 27/146* (2006.01)

(52) U.S. Cl.
CPC .... *H01L 27/14643* (2013.01); *H01L 27/1463* (2013.01); *H01L 27/14616* (2013.01);
(Continued)

(58) Field of Classification Search
CPC ............... H01L 25/167; H01L 31/0232; H01L 31/0352; H01L 31/109
See application file for complete search history.

(56) References Cited

U.S. PATENT DOCUMENTS

| 4,484,210 A | 11/1984 | Shiraki et al. |
| 9,012,960 B2 | 4/2015 | Okhonin |

(Continued)

FOREIGN PATENT DOCUMENTS

| CN | 101236995 A | 8/2008 |
| CN | 102901992 A | 1/2013 |

(Continued)

OTHER PUBLICATIONS

Cova, et al., "Avalanche photodiodes and quenching circuits for single-photon detection," Applied Optics, vol. 35, No. 12, pp. 1956-1976, Apr. 20, 1996.
(Continued)

*Primary Examiner* — Jae Lee
(74) *Attorney, Agent, or Firm* — Wilmer Cutler Pickering Hale and Dorr LLP

(57) ABSTRACT

A photodetector sensor array device as usable for camera chips comprises upper and lower contact layers of n+ and p+ semiconductor material either side of a light absorbing region made of either one layer, or two oppositely doped layers, of semiconductor material. Insulating trenches of dielectric material extending through the layers to form the individual pixels. Respective contacts are connected to the upper and lower contact layers so that each pixel can be reverse biased or forward biased. In operation, the device is reset with a reverse bias, and then switched to forward bias for sensing. After switching, carriers generated in response to photon absorption accumulate in potential wells in the light absorbing region and so reduce the potential barriers to the contact layers, which causes current to start to flow between the contacts after a time delay which is inversely proportional to the incident light intensity.

18 Claims, 20 Drawing Sheets

Related U.S. Application Data application No. 16/387,011, filed on Apr. 17, 2019, now Pat. No. 10,964,837, said application No. 16/429,158 is a continuation-in-part of application No. 16/387,011, filed on Apr. 17, 2019, now Pat. No. 10,964,837.

(52) U.S. Cl.
CPC .. *H01L 27/14623* (2013.01); *H01L 27/14632* (2013.01); *H01L 27/14636* (2013.01); *H01L 27/14685* (2013.01)

(56) References Cited

U.S. PATENT DOCUMENTS

| | | | |
|---|---|---|---|
| 9,142,692 B2 | 9/2015 | Sheu | |
| 9,236,520 B2 | 1/2016 | Okhonin et al. | |
| 9,431,566 B2 | 8/2016 | Okhonin | |
| 9,735,304 B1 | 8/2017 | Okhonin et al. | |
| 10,269,855 B2 | 4/2019 | Sallin et al. | |
| 10,964,837 B2 | 3/2021 | Sallin et al. | |
| 2003/0223053 A1 | 12/2003 | Liu et al. | |
| 2006/0039666 A1 | 2/2006 | Knights et al. | |
| 2008/0277701 A1* | 11/2008 | Lee | H01L 27/14647 257/292 |
| 2010/0230720 A1* | 9/2010 | Wicks | B82Y 20/00 257/188 |
| 2010/0237455 A1 | 9/2010 | Lee | |
| 2010/0271108 A1 | 10/2010 | Sanfilippo et al. | |
| 2011/0024808 A1 | 2/2011 | Janesick | |
| 2011/0133160 A1 | 6/2011 | Yu et al. | |
| 2011/0220969 A1 | 9/2011 | Masuoka et al. | |
| 2011/0272561 A1 | 11/2011 | Sanfilippo et al. | |
| 2011/0292380 A1 | 12/2011 | Bamji | |
| 2012/0056096 A1* | 3/2012 | Abeles | G01T 1/2018 250/366 |
| 2012/0313155 A1 | 12/2012 | Okhonin | |
| 2013/0056708 A1 | 3/2013 | Kim | |
| 2014/0159188 A1* | 6/2014 | Maimon | G01J 5/061 257/443 |
| 2015/0221806 A1 | 8/2015 | Okhonin | |
| 2017/0365636 A1 | 12/2017 | Mazzillo et al. | |
| 2018/0247968 A1 | 8/2018 | Na et al. | |
| 2019/0013427 A1* | 1/2019 | Ting | H01L 31/03046 |
| 2019/0067357 A1 | 2/2019 | Cheng et al. | |
| 2020/0185560 A1* | 6/2020 | Giroud-Garampon | H01L 31/1804 |

FOREIGN PATENT DOCUMENTS

| | | |
|---|---|---|
| JP | 2005-235893 A | 9/2005 |
| JP | 2005-303268 A | 10/2005 |
| JP | 2007-526448 A | 9/2007 |
| JP | 2011-007622 A | 1/2011 |
| WO | 2005/078801 A1 | 8/2005 |
| WO | WO-2013/124956 A1 | 8/2013 |

OTHER PUBLICATIONS

Fossum, et al., "A Review of the Pinned Photodiode for CCD and CMOS Image Sensors," IEEE Journal of the Electron Devices Society, vol. 2, No. 3, pp. 33-43, May 2014.

Takahashi, et al., "A 45 nm Stacked CMOS Image Sensor Process Technology for Submicron Pixel," Article, Sensors, MDPI, www.mdpi.com/journal/sensors, pp. 1-13, Basel, Switzerland, Dec. 5, 2017.

Daniel van Nieuwenhove, et al, "Photonic Demodulator with Sensitivity Control," IEEE Sensors Journal, IEEE Service Center, vol. 7, No. 3, Mar. 1, 2007, pp. 317-318 (2 pages).

Klein, P., et al., "Design and Performance of Semiconductor Detectors with Integrated Amplification and Charge Storage Capability," Nuclear Instruments & methods in Physics Research, Section A: Accelerators, Spectrometers, Detectors, and Associated Equipment, Elsevier BV, vol. A305, Aug. 1, 1991, pp. 517-526 (10 pages).

Sallin, Denis, et al., "MOS-PN Hybrid Device with Minimum Dark Current for Sensitive Digital Photdection," IEEE Photonics Technology Letters, IEEE Service Center, vol. 26, No. 20, Oct. 15, 2014, (4 pages).

Notification of International Search Report and Written Opinion dated Jun. 28, 2018 in related PCT/IB2018/000356 filed Mar. 16, 2018 (19 pages).

Notice of Reasons for Rejection received in related Japanese Patent Application No. 2016-547246 filed (6 pages).

Salman, et al., "Field Effect Diode (FED): A Novel Device for ESD protection in deep sub-micron SOI technologies," Electron Devices Meeting, 2006, IEDM '06 International, pp. 1-4 (4 pages).

Raissi et al., "A brief analysis of the field effect diode and breakdown translator," IEEE Transactions on Electron Devices, vol. 43, Issue 2, pp. 362-365 (4 pages).

European Communication received in related European Patent Application No. 18719992.2 dated Sep. 3, 2021 (5 pages).

\* cited by examiner

*PRIOR ART*

PHOTODETECTOR SENSOR ARRAYS

CROSS-REFERENCE TO RELATED APPLICATION

This non-provisional patent application is a continuation-in-part of non-provisional U.S. patent application Ser. No. 16/429,158 filed Jun. 3, 2019, which is incorporated herein by reference in its entirety for all purposes.

FIELD OF THE INVENTION

The present disclosure relates to photodetector sensor arrays.

BACKGROUND

Current commercial photodetector sensor arrays as used for smart phone cameras and high-quality digital stills cameras are mostly, if not all, based on the pinned photodiode (PPD) which is a photodiode design whose invention is largely credited to Shiraki, Teranishi & Ishihara at NEC Corporation in 1980 and which is described in U.S. Pat. No. 4,484,210. The PPD largely solved the problem of shutter lag in earlier sensor arrays. While the NEC invention was originally envisaged for CCD sensor arrays, the PPD was later developed in the 1990s and early 2000s for use in CMOS sensor arrays, which are now the standard sensor array type used in commercial cameras. Current CMOS sensor arrays mostly use the so-called active pixel sensor (APS) which is based on intra-pixel charge transfer.

FIG. 1A is a schematic cross-section of a PPD as used in a CMOS APS pixel. The PPD is based on a shallow p+ region over a thicker n-region which in turn is over a thicker p-region, so that the n- and p-regions create a pn-junction which acts in principle like a conventional pn (or p-i-n) photodetector when the PPD is held at a constant reverse bias voltage. Namely, incident photons are absorbed in a light absorbing n- and p-regions to generate electron-hole pairs. The n-region is also used to accumulate photo-generated charge and is hence referred to as a storage well (SW). The PPD has a transfer gate TG for charge transfer, which is interposed laterally in the p-type region between the n-region, i.e. the SW, and a floating n+ diffusion region FD.

FIG. 1B shows schematically the energy diagram of the PPD of FIG. 1A. As illustrated, the voltage applied to the TG is used to control transfer of accumulated charge for readout. In operation, the PPD's n-type SW region is first fully depleted while the TG is held at a voltage to prevent charge flow between the PPD and the FD. Then charge is accumulated in the SW from electron-hole generation in the n- and p-regions. When desired, the accumulated charge is then swept out to the FD by lowering the voltage at the TG to remove the potential barrier between the PPD and the FD.

FIG. 1C is an equivalent circuit of a CMOS APS pixel as used in current commercial cameras incorporating a PPD as shown in FIGS. 1A and 1B. The illustrated equivalent circuit is for the so-called 4T cell design which incorporates four CMOS transistors. Other CMOS APS pixel designs with three, five and six transistors, known as 3T, 5T and 6T designs, are also known. All these designs are based on a PPD and incorporate a transistor amplifier structure. The PPD together with its transfer gate TG and a floating diffusion region FD form one transistor whose potential is monitored and amplified by a source-follower transistor SF. In the 4T design, the third and fourth transistors are: a row select transistor SEL for readout and a reset transistor RST for resetting the FD between detection cycles.

As in a conventional pn-photodiode, the magnitude of the photocurrent in a CMOS APS sensor pixel is proportional to the number of electron-hole pairs generated by photon absorption in the p- and n-regions. However, in a CMOS APS pixel, instead of the electron-hole pairs being swept out to the contacts as they are generated, as in a simple pn-junction photodetector, the output photocurrent is the current output to a column bus via the SF which in turn is proportional to the amount of charge transferred from the PPD to the FD.

More generally, there is of course a desire for sensor arrays to have ever smaller pixels, so that higher resolution can be achieved without making the sensor chip area larger, which also increases power consumption. For example, current sensor chips for high-end stills cameras from Canon, Sony, Nikon etc. may have an area of up to 20 mm×30 mm which is too big to fit in a typical smart phone and also would consume too much power to be suitable for smart phones. During the period from around 2000 to 2010, pixel pitch reduced from about 10 micrometers to about 1 micrometer. However, over the last decade further reductions in pixel pitch have proven difficult. The reason lies in the aspect ratio of the pixels. With a 10 micrometer pixel size, a pixel is essentially a planar structure with a width several times greater than its depth. Edge effects caused by the trenches which isolate the pixels from each other are not too problematic. However, with a 1 micrometer pixel size, the pixel is column-like with a width smaller than its depth, i.e. an aspect ratio significantly less than one. The trenches separating adjacent pixels then become significant.

The trenches are associated with high defect densities and form a depletion region that starts to encroach on the carrier drift and accumulation regions of the pixel. In terms of electrical performance, the edges start to constitute a significant dark current source.

A non-traditional type of photodetector is disclosed in US 2012/313155 A1 and subsequent patent applications from Actlight SA of Lausanne, Switzerland. The Actlight photodetector operates using pulsed voltages that are switched from reverse bias to forward bias. Switching to forward bias induces a photocurrent to flow across the device structure. However, the onset of the flow of photocurrent is not instantaneous, but rather occurs after a time delay from the onset of the light incidence. This time delay is referred to as the triggering time. The triggering time is proportional to the inverse of the light intensity, so triggering time is used as the measure of the intensity of the incident light.

FIG. 2A and FIG. 2B are schematic representations in section and plan view respectively of an Actlight photodetector 1 as disclosed in US 2012/313155 A1. The growth direction, i.e. orthogonal to the plane of the wafer, is marked as the z-direction. First and second gates G1, G2 held at voltages VG1 and VG2 extend in the y-direction. The direction orthogonal to the gates, in which the electrons and holes are swept out, is the x-direction. The section AA of FIG. 2A is in the xz-plane as indicated in FIG. 2B. The gates G1, G2 are arranged either side of a light absorbing layer 15 the central part of which is open for receipt of incident photons. The light absorbing layer 15 may be an intrinsic or a doped semiconductor such as silicon or germanium suitable for absorbing incoming photons of the wavelength range to be detected. Highly doped n+ and p+ regions are arranged either side of the body region 15 beyond the gates and serve as outputs for reading out the photosignal. The layers of the photodetector 1 are epitaxially fabricated on a semiconductor-on-insulator (SOI) substrate 3 comprising a silicon wafer and buffer layer 7 on which is deposited a layer of insulator 8. The gates G1, G2 are made of a conductive material (e.g. metal, silicide or semiconductor). The gates G1, G2 are spaced from the light absorbing layer 15 via insulator or dielectric material 4, e.g. silicon oxide or silicon nitride. The photodetector 1 is operated with the following bias voltages. A negative voltage VG1 is applied to gate G1 (for example, −2V), a negative or zero voltage V1 is applied to the n+ region, a positive voltage VG2 applied to gate G2 (for example, 2V) and a positive voltage V2 (for example, 1V) is applied to the p+ region. The triggering time of the photodetector is a function of the electric field in the light absorbing layer 15 and his hence tunable by adjusting the gate voltages. Under these bias conditions, photons incident onto the light absorbing region 15 between the gates, e.g. from a fiber optic device 30, are absorbed and thereby generate electron-hole pairs which are then swept out by the electric field induced by the bias voltages and so detected as current flowing between the n+ and p+ regions. The Actlight photodetector can be integrated to form CMOS sensor arrays as disclosed in the above-mentioned US 2012/313155 A1 (see FIG. 13 thereof).

BRIEF SUMMARY OF THE INVENTION

According to one aspect of the disclosure there is provided a sensor array device with an array of sensing pixels, in one or two dimensions, the device comprising: an upper contact layer composed of a highly doped p-type or n-type semiconductor material; a lower contact layer composed of a highly doped n-type or p-type semiconductor material of opposite type to the upper contact layer; a light absorbing layer of doped semiconductor material sandwiched between the upper and lower contact layers, the light absorbing layer being configured to generate pairs of oppositely charged carriers in response to absorption of photons when light is incident on the device; a mesh of insulating trenches of dielectric material extending vertically through the upper contact layer and at least a proportion of the doped light absorbing layer to subdivide the layers into an array of laterally adjacent, independently contactable columns of semiconductor material that form the pixels; and upper and lower contacts connected to respective pixels of the upper and lower contact layers so that, after a voltage applied between the upper and lower contacts of a pixel is switched from a reverse bias to a forward bias, carriers which are generated in the light absorbing layer in response to photon absorption accumulate in the light absorbing layer, which causes current to start to flow between the upper and lower contacts after a time delay which is inversely proportional to the incident light intensity.

Certain embodiments of the disclosure can provide a very simple pixel design based on a sequence of planar layers and vertical carrier transport. The design has essentially no in-plane structural complexity as a consequence of the carrier transport not being in plane but rather vertical. Moreover, each pixel only needs one or two contacts at the top, depending on the embodiment, and one at the bottom. The simplicity of the pixel design not only makes operation of the sensor array simple, but also provides for excellent scalability and manufacturability in terms of shrinking pixel pitch and increasing the total number of pixels in the array. Moreover, in contrast to CMOS APS designs using PPDs, our design does not require any transistor integration, since the signal is fundamentally a digital one based on measuring a time delay, and since the strength of the signal can be made to be sufficiently high that amplification is not needed. The requirement in CMOS APS designs of having to integrate a photodiode and transistors into every pixel is absent in our design.

In some embodiments, the pixel-forming columns have an aspect ratio of less than unity. We define aspect ratio as the lateral separation between adjacent pixels ratio divided by the depth of the light absorbing layer and. Our design is particularly suited to small aspect ratios owing to the lack of lateral structure and the vertical carrier transport.

In one group of embodiments, the doped light absorbing layer is subdivided into oppositely doped upper and lower layers of semiconductor material which are arranged together with the oppositely doped upper and lower contact layers in a vertical doping sequence of n+ p n p+.

In another group of embodiments, the doped light absorbing layer extends with a single type of doping between the upper and lower contact layers and is configured so that, in each pixel, when a reverse bias voltage is applied between the upper and lower contacts a charge sink is created in the doped light absorbing layer adjacent one of the contacts, and, when the voltage is switched from reverse bias to forward bias, carriers generated in the light absorbing layer in response to photon absorption initially accumulate at the charge sink and then, after the charge sink approaches saturation, current starts to flow between the contacts, the onset of current flow occurring after a time delay from the switching which is inversely proportional to the incident light intensity. In this group of embodiments, the pixels within their upper contact layer may each have a portion connected to the upper contact which is separated from surrounding portions of the upper contact layer by a closed loop of the doped semiconductor material of the light absorbing layer, so that the charge sink is provided by a depletion region which is formed around the portion of the upper contact layer connected to the upper contact when a reverse bias voltage is applied between the upper and lower contacts. Alternatively, each pixel may further comprise one or more islands of doped semiconductor material, preferably highly doped (e.g. n+ or p+), where the islands are oppositely doped to the semiconductor material of the doped light absorbing layer within which they are contained, so that the charge sink is provided by forming a depletion region at the island(s) when a reverse bias voltage is applied between the upper and lower contacts. Moreover, the pixels within their upper contact layer may each have a portion connected to the upper contact which is separated from surrounding portions of the upper contact layer by a closed loop of highly doped semiconductor material of opposite dopant type, the closed loop having its own contact, and the islands being proximal said portion of the upper contact layer connected to the upper contact.

The pixel-forming columns have sidewalls adjacent the dielectric material of the trenches, and these sidewalls may advantageously be doped to passivate surface defects. Namely, the sidewalls may be provided with a highly doped cladding over at least a portion of their vertical extent. In some embodiments, at least a lower portion of the sidewalls has a highly doped cladding with a dopant of the same doping type as that of the lower contact layer so that the highly doped cladding forms an electrical extension of the lower contact layer around the columns. In some embodiments, at least an upper portion of the sidewalls has a highly doped cladding with a dopant of the same doping type as that of the upper contact layer, so the highly doped cladding forms an electrical extension of the upper contact layer around the columns. Moreover, the lower and upper contact layers may be electrically separated from each other by first and second highly doped sidewall cladding portions such that the lower and upper contact layers and the interposed highly doped sidewall cladding portions are in a vertical doping sequence of p+ n+ p+ n+.

The dielectric trenches need not extend right through the epitaxial structure. For example, in some embodiments, the dielectric trenches terminate vertically above the lower contact layer and the lower contact is a blanket contact for the array. This is an alternative to having the dielectric trenches extending vertically completely through the doped light absorbing layer and also through the lower contact layer, in which case the lower contact comprises an array of contacts connected to respective pixels of the lower contact layer.

A subpixel structure may also be advantageous in some circumstances. In such as design, some of the dielectric trenches terminate vertically above the lower contact layer whereas others extend vertically completely through the doped light absorbing layer and the lower contact layer. This forms an array of pixel groups, each pixel group having its own lower contact which is common to the pixels of that group. We refer to the pixels in the same group as being subpixels.

The proposed sensor chip can be incorporated into a module with other chips fabricated in different wafers using different processes. The modules may be based on front or back illumination, i.e. the additional chip(s) may be attached either to the front (upper) side of the sensor array chip for back illumination, or the back (lower) side of the sensor array chip for front illumination.

An integrated sensor array module may be provided that comprises a first chip with a sensor array device as described above mounted together with a processor device formed as a second chip. The respective chips may then be manufactured independently on separate wafers using respective materials and fabrication processes optimized to each. The processor chip comprises an array of pixel-specific processing elements for the pixels of the sensor chip. The processor chip is mounted on the sensor chip. Vias between the two chips form electrical connections between each of the pixel-specific processing elements of the processor chip and pixel contacts of corresponding pixels in the sensor array device. The integration is thus vertical with one-to-one correspondence between the pixels of the sensor array and processing elements in the processor chip. The integration may be taken a step further by also attaching a memory chip to the module. The memory device is formed as a third chip from a third wafer and comprises pixel-specific memory elements for the pixels of the sensor chip. The memory chip is mounted on the processor chip so that further vias form electrical connections between each of the pixel-specific processing elements of the processor chip and the pixel-specific memory elements in the memory chip. The memory may be a random access memory, such as a DRAM, for example.

According to a further aspect of the disclosure there is provided a method of manufacturing a photodetector device, the method comprising: fabricating a semiconductor epitaxial structure comprising: an upper contact layer composed of a highly doped p-type or n-type semiconductor material; a lower contact layer composed of a highly doped n-type or p-type semiconductor material of opposite type to the upper contact layer, and a light absorbing layer of doped semiconductor material sandwiched between the upper and lower contact layers, the light absorbing layer being configured to generate pairs of oppositely charged carriers in response to absorption of photons when light is incident on the device; etching a mesh of trenches vertically through the upper contact layer and at least a proportion of the doped light absorbing layer to subdivide the layers into an array of laterally adjacent, independently contactable columns of semiconductor material that are to form the pixels; filling the trenches with dielectric material to make them insulating; and providing upper and lower contacts to the pixels of the upper and lower contact layers so that, in the photodetector device after a voltage applied between the upper and lower contacts of a pixel is switched from a reverse bias to a forward bias, carriers which are generated in the light absorbing layer in response to photon absorption accumulate in the light absorbing layer, which causes current to start to flow between the upper and lower contacts after a time delay which is inversely proportional to the incident light intensity.

According to another aspect of the disclosure there is provided a method of operating a photodetector device, the method comprising: providing a photodetector device with: an upper contact layer composed of a highly doped p-type or n-type semiconductor material; a lower contact layer composed of a highly doped n-type or p-type semiconductor material of opposite type to the upper contact layer; a light absorbing layer of doped semiconductor material sandwiched between the upper and lower contact layers, the light absorbing layer being configured to generate pairs of oppositely charged carriers in response to absorption of photons when light is incident on the device; a mesh of insulating trenches of dielectric material extending vertically through the upper contact layer and at least a proportion of the doped light absorbing layer to subdivide the layers into an array of laterally adjacent, independently contactable columns of semiconductor material that form the pixels; and upper and lower contacts connected to respective pixels of the upper and lower contact layers; and operating the photodetector device by repeatedly: applying a reverse bias voltage between the upper and lower contacts; switching the reverse bias voltage to a forward bias voltage so that carriers which are subsequently generated in the light absorbing layer in response to photon absorption accumulate in the light absorbing layer; and sensing for onset of current flow between the upper and lower contacts and measuring a time delay between said switching and said onset, wherein the time delay is inversely proportional to the incident light intensity.

The light absorbing layer forms a light absorbing region which may be made of a single semiconductor material. The light absorbing layer or region may consist of one or more doping layers or regions. In some embodiments, the light absorbing layer or region is made of a single layer of semiconductor material doped with the same dopant type, e.g. all p-doped or all n-doped. In other embodiments, the light absorbing layer or region is made of a single semiconductor material but with different n- and p-doped layers or regions so that a pn-junction is formed, the pn-junction between the p-type and n-type regions thus being a homojunction. In still further embodiments, the light absorbing layer or region is made of different semiconductor materials so that the pn-junction between the p-type and n-type regions is a heterojunction. With a heterojunction, the two different materials may be in the same materials' system and so be capable of forming alloys with each other, e.g. the SiGeC materials' system, or the GaAlInAsP materials' system. It will be understood that the semiconductor material(s) from which the light absorbing layer or region is made are selected having regard to their band gaps in order that interband absorption of photons occurs over a desired energy range, e.g. the visible or near-infrared, as required by the photodetector to fulfil a specification.

BRIEF DESCRIPTION OF THE DRAWINGS

In the following, the present invention will further be described by way of example only with reference to exemplary embodiments illustrated in the figures.

DETAILED DESCRIPTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 3A:
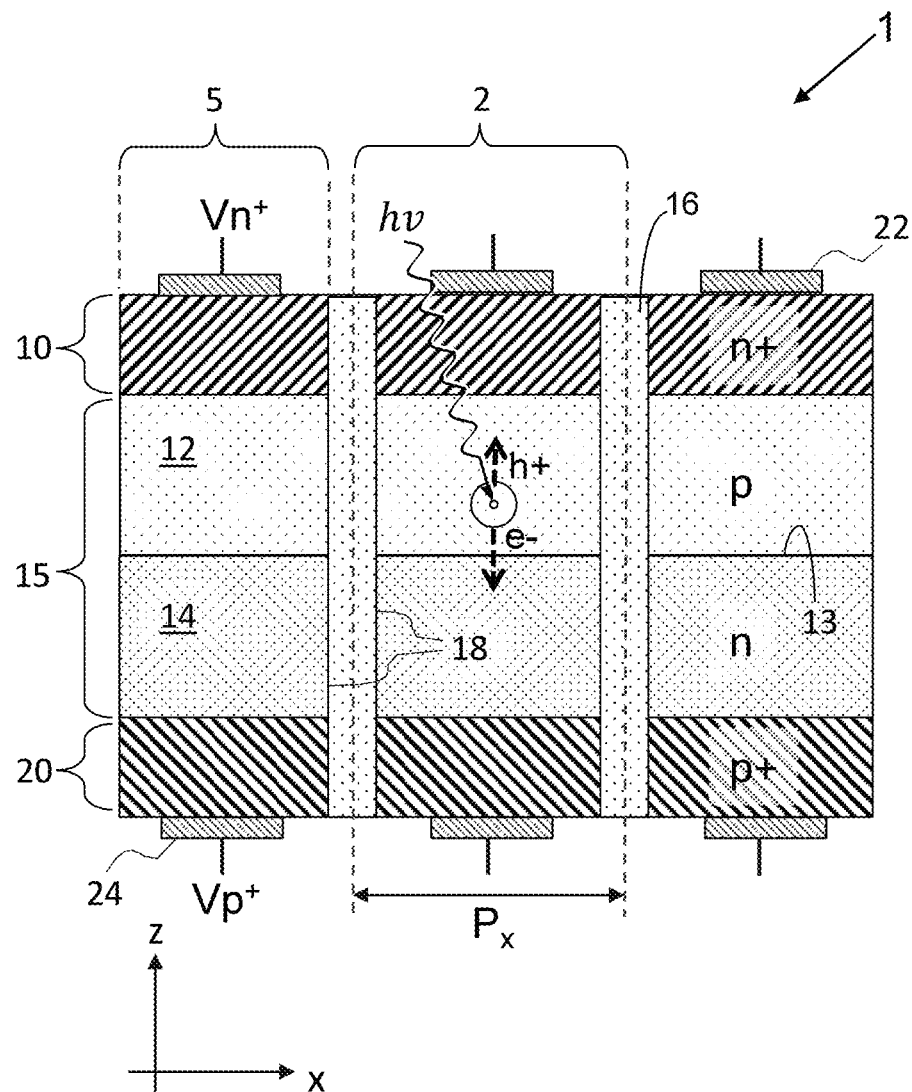
FIG. 3A is a schematic cross-section in the xz-plane of three sensing pixels of a sensor array device according to a first embodiment.
Figure 3B:
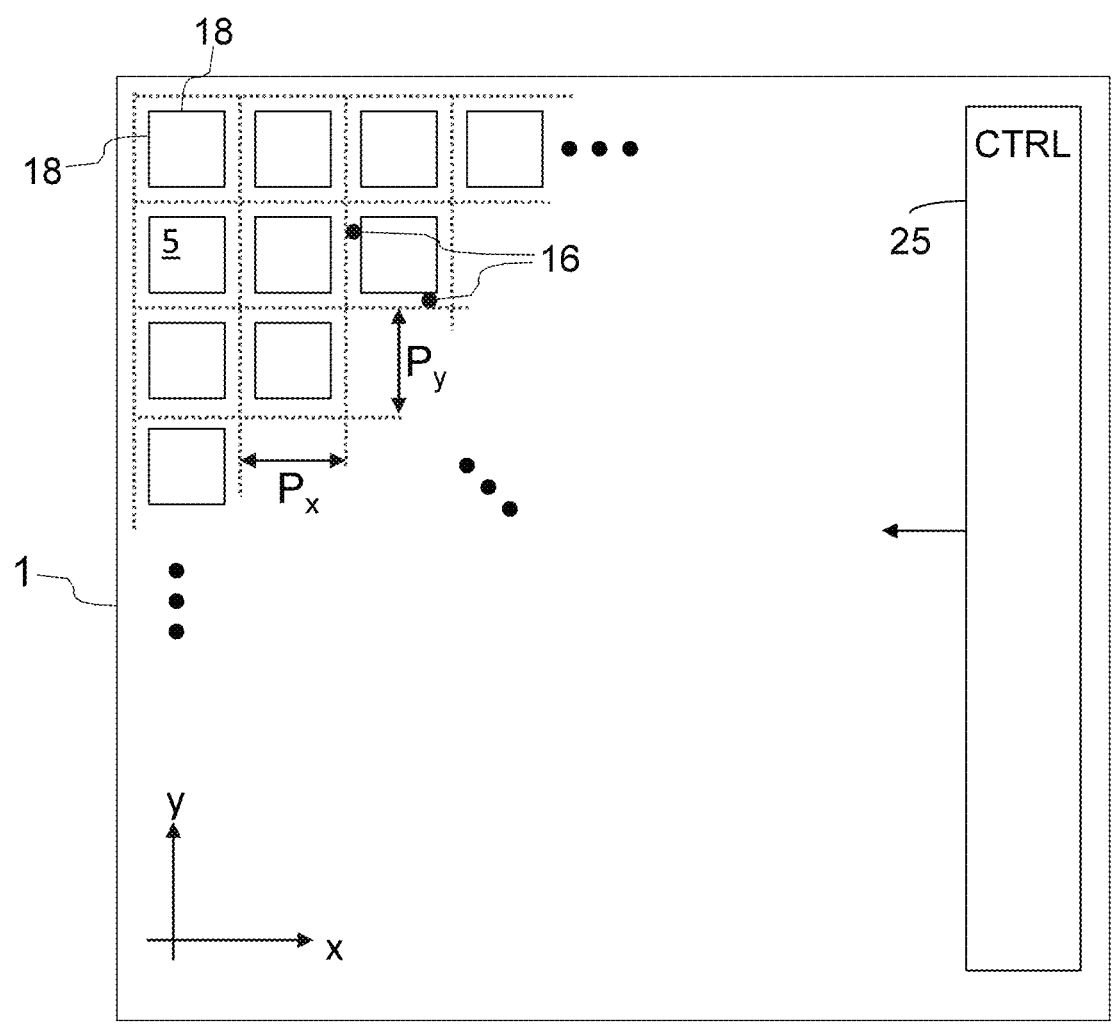
FIG. 3B is a schematic plan view in the xy-plane of the sensor array device of FIG. 3A.

FIG. 3A is a schematic cross-section in the xz-plane of three sensing pixels 2 of a sensor array device 1 according to a first embodiment, each pixel 2 being an independently operable photodetector. FIG. 3B is a schematic plan view of the same sensor array device 1 and shows that the sensing pixels 2 are arranged in a two-dimensional array with pixel pitches Px and Py in the x and y directions respectively. (Other embodiments may have a one-dimensional pixel array.) The pitches Px, Py may be equal to form a square array or they may be different to form a rectangular array. Each pixel 2 is formed by a column 5 of semiconductor material which is electrically isolated from its neighbors by dielectric, i.e. electrically insulating, material which fills trenches 16 between the columns 5. The columns 5 thus have sidewalls 18 which are adjacent the dielectric material of the trenches 16. There is thus provided a two-dimensional array of laterally adjacent, independently contactable columns 5 of semiconductor material that form the pixels 2. The sensor array device 1 may also have areas for control or other electronics components 25 formed in the same wafer as schematically illustrated in FIG. 3B. The growth direction, i.e. orthogonal to the plane of the wafer, is marked as the z-direction, with the epitaxial layers being in the xy-plane. The layers of the photodetector are epitaxially fabricated on a semiconductor-on-insulator (SOI) substrate, for example.

Referring to FIG. 3A, the semiconductor part of the structure is made up of the layer sequence, from bottom-to-top: p+, n, p, n+. Namely, there is a lower contact layer 20 composed of a highly doped p-type semiconductor material (denoted p+), a lower layer 14 of n-type doped semiconductor material (denoted n), an upper layer 12 of p-type semiconductor material (denoted p), these two layers collectively forming a light absorbing region 15, and an upper contact layer 10 composed of a highly doped n-type semiconductor material (denoted n+). The highly doped material may be doped sufficiently highly to be degenerate, i.e. so that the doping centers merge into a miniband allowing electrons or holes to move without needing to transfer into the adjacent conduction or valence band respectively, or may be doped at a lower level than the threshold for degenerate doping, but nevertheless significantly higher than the doping concentrations in the light absorbing region 15. The light absorbing region 15 thus forms a pn-junction 13 sandwiched between the upper and lower contact layers 10, 20. The light absorbing region 15 is configured to generate pairs of oppositely charged carriers, i.e. electrons 'e⁻' and holes 'h⁺', in response to absorption of photons 'hv' when light is incident on the device. The trenches 16 form a mesh of dielectric material extending vertically through the upper contact layer 10 and at least a proportion of the doped light absorbing region 15, and optionally through the whole light absorbing region 15 and further optionally also through the lower contact layer 20.

Referring to FIG. 3B, the detector array may include, in addition to the array of sensors, control circuitry 25 to manage the acquisition, capture and/or sensing operations of the light sensors of the array. For example, the control circuitry (which may be integrated on the same substrate as the sensors) may control or enable/disable the sensors in a manner so that data acquisition or sensing correlates to the data rate of the transmission; the detector array may be coupled to a plurality of fiber optic output devices wherein each fiber optic device is associated with one of the sensors, or a group of the sensors. The sensors may be configured and/or arranged in any array architecture as well as in conjunction with any type of integrated circuitry. Further, any suitable manufacturing technique may be employed to fabricate the array.

The planar layers of semiconductor material, 10, 12, 14, 20 are thus subdivided into a two-dimensional array of laterally adjacent, independently contactable columns 5 that form the pixels 2. Upper and lower contacts 22, 24 are connected to respective pixel columns 5 of the upper and lower contact layers 10, 20. More generally, the lower contact layer 20 is doped in the opposite sense to the upper contact layer 10, bearing in mind for any embodiment described herein, there will be an equivalent 'mirrored' embodiment in which the doping senses of all the semiconductor layers or regions are reversed.

It is illustrated that the dielectric trenches 16 extend vertically completely through the light absorbing layers 12, 14 and also through the lower contact layer 20. The lower contact 24 then is implemented as an array of individual contacts connected to respective pixel columns 5 by the part of the lower contact layer 20 at the base of each column. A variant (not illustrated) is for the dielectric trenches 16 to terminate vertically above the lower contact layer 20, e.g. at or near the bottom of the lower light absorbing layer 14. The lower contact 20 would then be a blanket contact, i.e. one common contact for all pixels in the array.

Figure 1A:
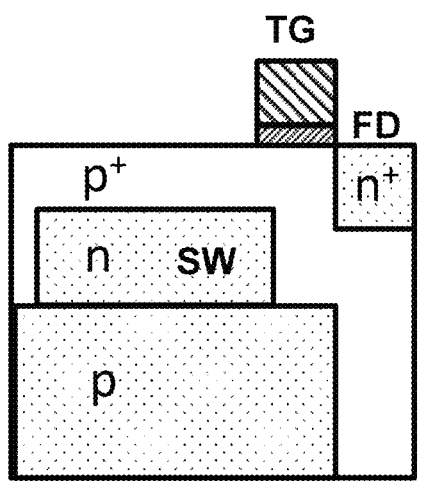
FIG. 1A is a schematic cross-section of a standard PPD as used in a CMOS APS pixel as used in current commercial cameras.
Figure 1B:
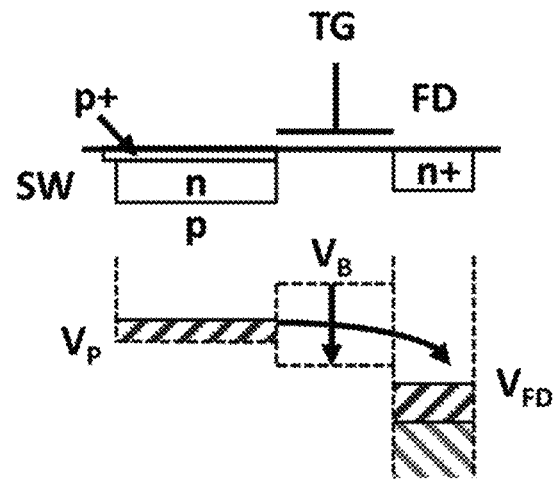
FIG. 1B is a schematic cross-sectional energy band diagram of the PPD of FIG. 1A.
Figure 1C:
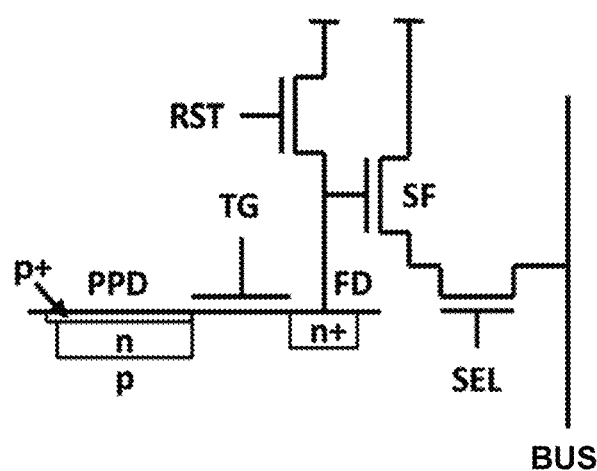
FIG. 1C is an equivalent circuit of a CMOS APS pixel as used in current commercial cameras incorporating a PPD as shown in FIGS. 1A and 1B.
Figure 2A:
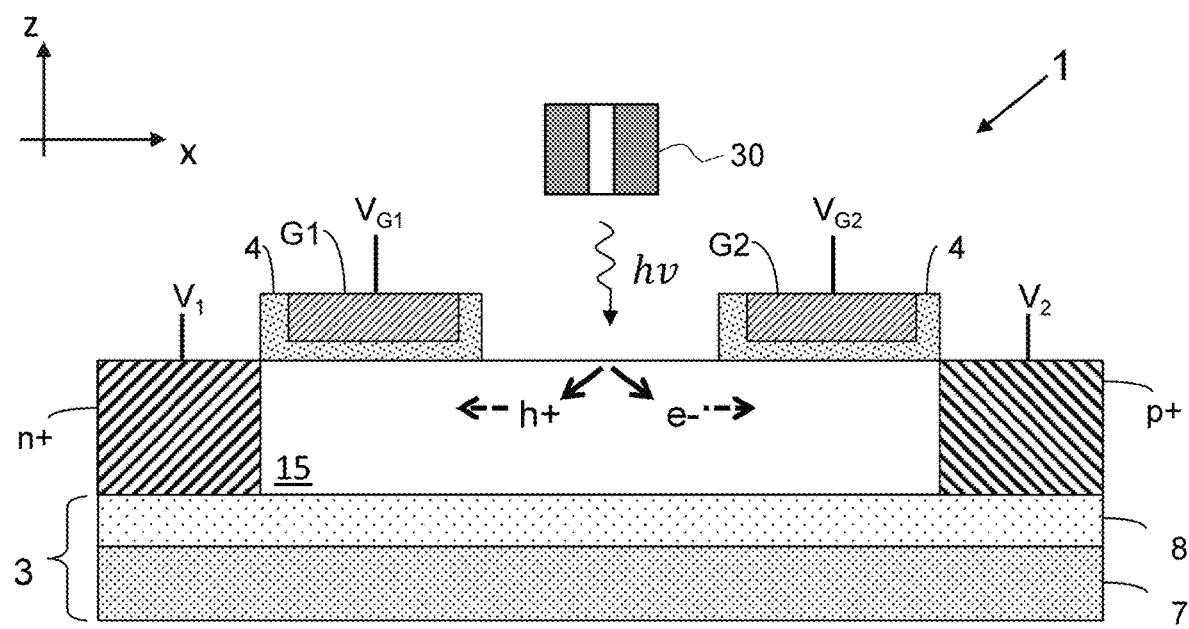
FIGS. 2A and 2B are schematic representations in section and plan view respectively of a prior art photodetector as disclosed in US 2012/313155 A1.
Figure 2B:
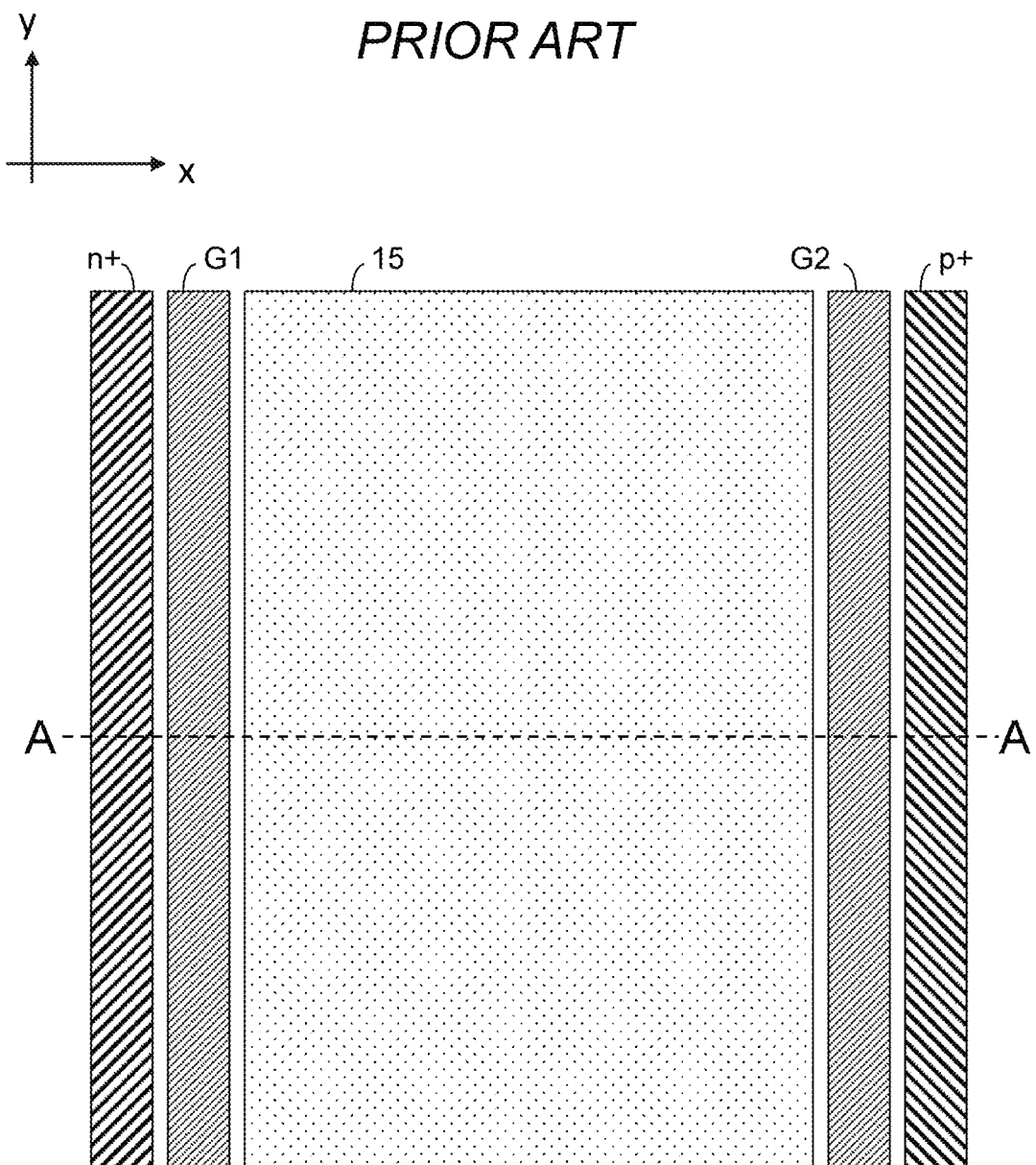

It is noted that as schematically illustrated in FIG. 3A for the xz-plane, the pixel-forming columns 5 may have an aspect ratio of less than unity as defined by the depth of the light absorbing region 15 being greater than the lateral separation between adjacent pixels, i.e. the pixel pitch Px in the xz-plane (or Py in the yz-plane). Generally, the thickness of the light absorbing region 15 will be dictated by the physics, i.e. absorption length of photons of the desired wavelength range in the semiconductor material used for the light absorbing region. For detection in the visible range with silicon as the semiconductor material, the thickness of the light absorption region will be perhaps 2-5 micrometers. The present design is particularly suited to small pitch size, and hence small aspect ratios of perhaps 0.1 to 0.3 (or 0.4), since the carrier transport direction is vertical not lateral, and since there is effectively no lateral structure in the pixel column compared with a conventional PPD-based pixel design of a CMOS APS as described above with reference to FIGS. 1A to 1C.

We refer to the embodiment of FIG. 3A as a vertical device. By vertical, we mean that the layers are epitaxially formed in the xy-plane, which is the plane of the substrate, so the layer sequence is in the z-direction. The structure is subdivided into individual pixels, in a two-dimensional array of rows and columns (or alternatively a one-dimensional array of rows) by insulating trenches filled with dielectric material that electrically isolate adjacent pixels from each other. The dielectric material may be material that is deposited after etching, or material that is generated by an oxidization process after etching, for example. Instead of filling the trenches with dielectric material, they could be left unfilled or only be partly filled by a thin layer of oxide or other insulating material coating the sides of the trenches. The insulating trenches thus extend vertically through the light absorbing regions and at least one of the contact regions so as to subdivide the photodetector into an array of pixels that are independently contactable.

Semiconductor layers are deposited on a suitable substrate in the sequence p+n p n+ as illustrated, or in the reverse sequence. The doping of each layer may be achieved at the time of deposition, or through post-deposition processes, such as ion implantation, or a combination of both, as desired. The n-type and p-type layers form the detector's light absorbing regions and the n+ and p+ layers its contact regions. The n-type and p-type layers have an interface which forms a pn-junction. The n-type and p-type layers have band gaps suitable for absorbing photons of a specified wavelength (energy) range and generate pairs of electrons and holes that, when the device is under forward bias, drift in opposite directions according to the electric field they experience at the point of their creation and move towards their respective potential wells, as shown in FIGS. 4B and 4C (see text below). An electron-hole pair generated by absorption of a photon in the p-layer (as schematically illustrated) or in the n-layer while the device is under forward bias are separated by the forward-bias induced applied electric field. If the photon absorption is close to the pn-junction then the holes drift initially towards the n+ layer and electrons initially towards the p+ layer as shown schematically in FIG. 3A. The electrons and holes then accumulate in their respective potential wells in the conduction and valence bands as shown schematically in FIG. 4C. The substrate is not shown, but a suitable substrate, such as a p+ substrate for ohmically contacting the pixels of the p+ layer, may be provided. When the structure is switched from a reverse bias to a forward bias in respect of the pn-junction, electron-hole pairs generated by photon absorption initiate a current flow between the contacts once a sufficient number of electrons and holes have accumulated in their respective potential wells to cause the potential barrier to the contacts to be decreased sufficiently. There is thus a time delay from the reverse-to-forward bias switching event to the onset of current flow which is inversely proportional to the incident light intensity.

The photodetector is operated by repeated cycles of switching from reverse to forward bias. Namely, operation proceeds by applying a voltage to reverse bias the n+ and p+ contacts; switching the reverse bias voltage to a forward bias voltage. After the switching, electrons and holes which are generated in the light absorbing regions in response to photon absorption drift towards and accumulate in the respective conduction band and valence band potential wells. The device then senses for onset of current flow between the first and second contacts. The time delay between said switching and said onset is measured, the time delay being inversely proportional to the incident light intensity. This reverse-to-forward biasing sequence is then repeated. The repeat cycling of the drive and read out may be periodic or aperiodic. In the periodic case, the duration of the forward bias and reverse bias segments are fixed. In the aperiodic case, the reverse bias segment is of fixed duration, but the forward bias duration is varied responsive to the incident light intensity within a time window set between a minimum value and a maximum value. After onset of current has occurred, and the time delay has been measured, the forward bias segment of the cycle can be terminated. The forward bias duration will then have the maximum value when there is no incident light, since there will be no onset of current, and have the minimum value when the incident light intensity is high, since the time delay will be shorter than the minimum value, but have an intermediate value when the incident light intensity is such that the time delay for the onset of current is within the window.

Figure 4A:
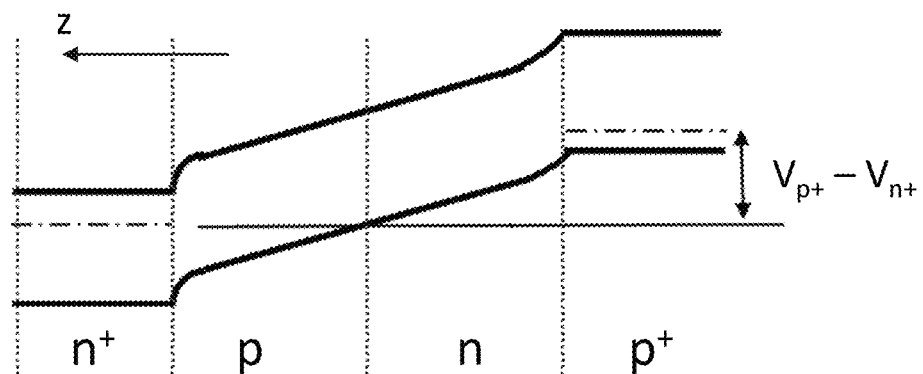
FIGS. 4A, 4B, and 4C are energy band diagrams showing a photodetector pixel according to the first embodiment with the photodetector pixel respectively in a reversed-biased state, in a forward-biased non-conducting state and in a forward-biased conducting state.
Figure 4B:
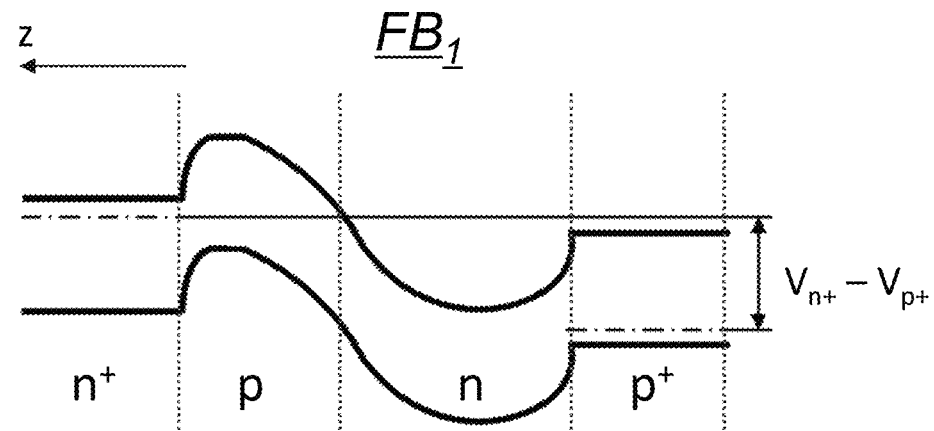
Figure 4C:
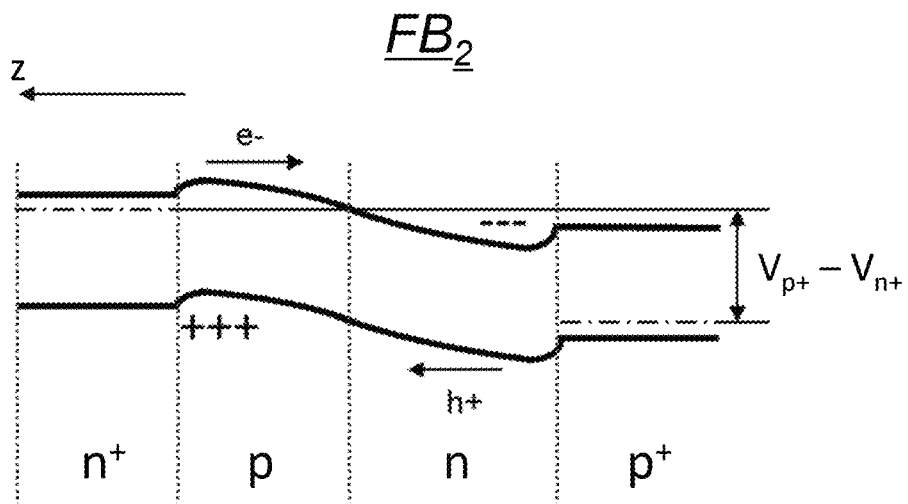

FIGS. 4A, 4B and 4C are energy band diagrams along the z-direction showing how pixels of the device operate to sense light. A pixel is initially reset by applying a reverse bias RB voltage to the vertical p+, n, p, n+ structure as shown in FIG. 4A via the contacts 22, 24. The pixel is then switched from a reverse bias RB to a forward bias FB. The energy band diagram immediately after switching to FB is as shown in FIG. 4B. Subsequent to the switching to FB, the pairs of electrons and holes which are generated in the light absorbing region, i.e. either in p-type layer 12 or n-type layer 14 in response to photon absorption, drift towards and accumulate in their respective potential wells in the conduction and valence bands. Over time as photons are absorbed, more and more holes and electrons accumulate in their respective potential wells. The potential barriers between the layers 12 & 14 and the contact layers 10 & 20 is thus gradually reduced until such time as the potential barrier is removed, or is at least small enough to allow thermal transport of carriers over the remaining barrier height, as shown in FIG. 4C. Current will then flow between the contacts 22, 24. Current starts to flow after a time delay which is inversely proportional to the incident light intensity, since a certain number of electron-hole pairs will be required to reduce the potential barrier sufficiently.

A reset in RB, i.e. the state shown in FIG. 4A can be produced, by way of example, by setting:

$Vp^+ = Vdd/2$ and $Vn^+ = Vdd$ where Vdd is the supply voltage. The FB sensing mode of FIGS. 4B and 4C can be produced, by way of example, by setting:

$Vp^+ = Vdd/2$ and $Vn^+ = 0$

FIGS. 4A, 4B, and 4C are energy band diagrams along the z-direction. FIG. 4A shows the photodetector in reverse bias. FIGS. 4B and 4C both show the photodetector in forward bias with a bias voltage $Vp^+ - Vn^+$. FIG. 4B shows a condition after reset before any photons have been absorbed, e.g. directly after switching from RB, in which the structure is in a non-conducting state. FIG. 4C shows a condition after a sufficient number of photons have been absorbed to cause the structure to be in a conducting state. Namely, in forward bias, when the sensor has not yet absorbed any light, or an insufficient amount of light, little to no current flows between the p+ and n+ regions 20, 10 due to the potential barriers. However, when light is incident on the forward biased structure, the incident photons are absorbed to generate electron-hole pairs and the sensor changes after a time to a conducting state. Namely, under the electric field generated by the bias voltage, the photon-generated holes drift towards and accumulate in the valence band potential well in the p-region 12 adjacent the n+ contact region 10 and induce a lowering of the potential barrier between the p-region 12 and the n+ contact region 10. Similarly, the photon-generated electrons drift towards and accumulate in the conduction band potential well in the n-region 14 adjacent the p+ contact region 20 and induce a lowering of the potential barrier between the n-region 14 and the p+ region 20. In its conductive state, the sensor provides a large internal current gain. In addition, a positive feedback mechanism accelerates accumulation of excess positive and negative carriers adjacent the respective n+ and p+ contact regions 10, 20, which, in turn, reduce the potential barriers related corresponding to such regions and, when the barriers have been sufficiently reduced, causes a current to flow between the p+ and n+ regions of the light sensor and an output current upon detecting or in response to the incident light.

Figure 5:
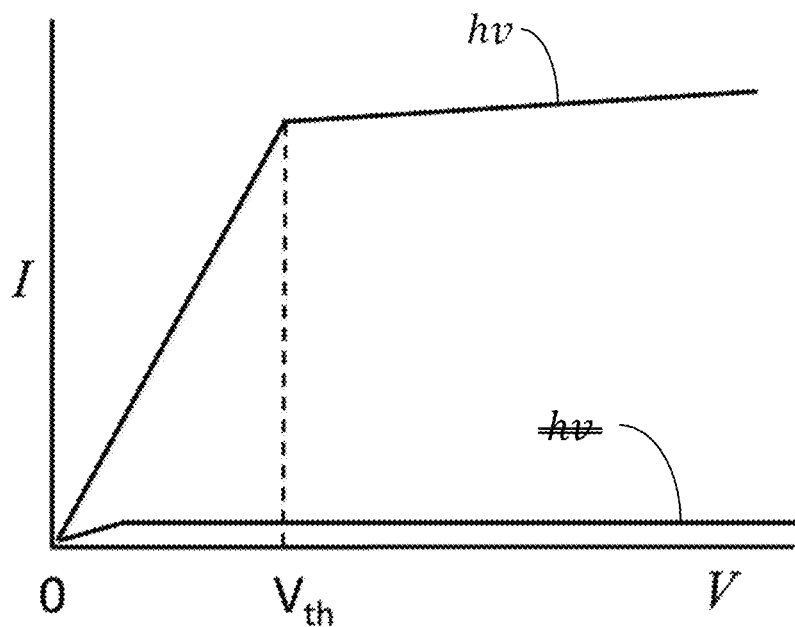
FIG. 5 is a graph of output current as a function of bias voltage for the photodetector according to the first embodiment of FIGS. 3A and 3B with and without incident light, i.e. the forward-biased conducting and non-conducting states of FIGS. 4C and 4B respectively.

FIG. 5 is a schematic graph showing output current of the photodetector as a function of bias voltage $Vp^+ - Vn^+$ between the n+ and p+ contact regions when incident light is detected (ON/hv), and is not, detected (OFF/ℏ), i.e. the conducting and non-conducting states of FIGS. 4C and 4B respectively. It is noted that above a threshold bias voltage Vth, the output current in the conducting state is more or less static with varying bias voltage, which is a preferred operating regime given that incident light intensity is measured by triggering time, not current magnitude.

Figure 6A:
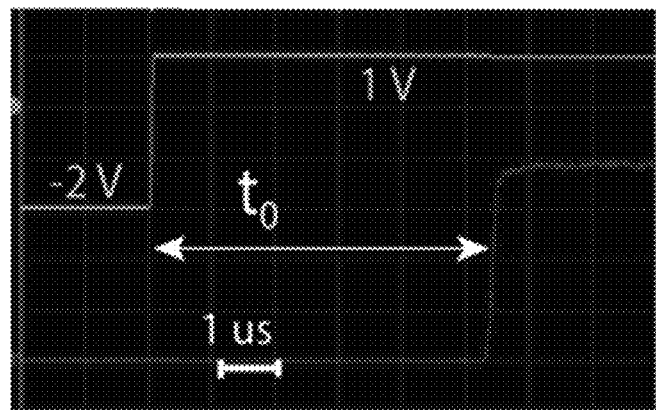
FIGS. 6A and 6B show oscilloscope screen shots of applied voltage $V_d$ and output current I without and with light, respectively.
Figure 6B:
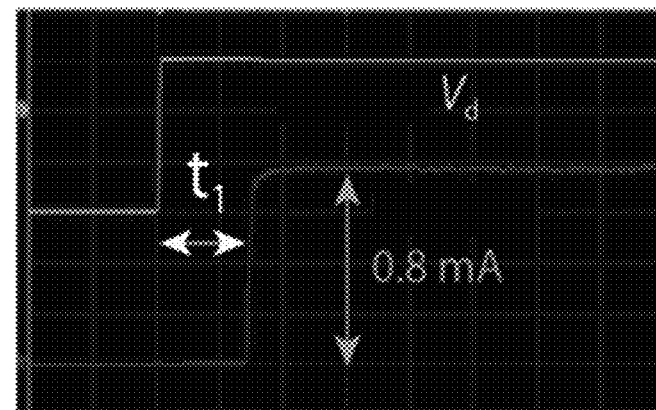

FIGS. 6A and 6B show an oscilloscope screen shot of applied voltage $Vd = Vp^+ - Vn^+$ and output current I without and with light, respectively. Triggering time, t, decreases with increase in light intensity. FIG. 6A shows a triggering time of $t0 = 5.5$ μs with no light. FIG. 6B shows a triggering time of $t1 = 1.5$ μs with light at an absorbed power of 35 nW. Switching from a low current state to a high current state occurs very abruptly, which is favorable for precise measurements of delay time. The output current of 0.8 mA is more than four orders higher than an output current that could be achieved with a conventional photodiode at an absorbed power of 35 nW.

Figure 7:
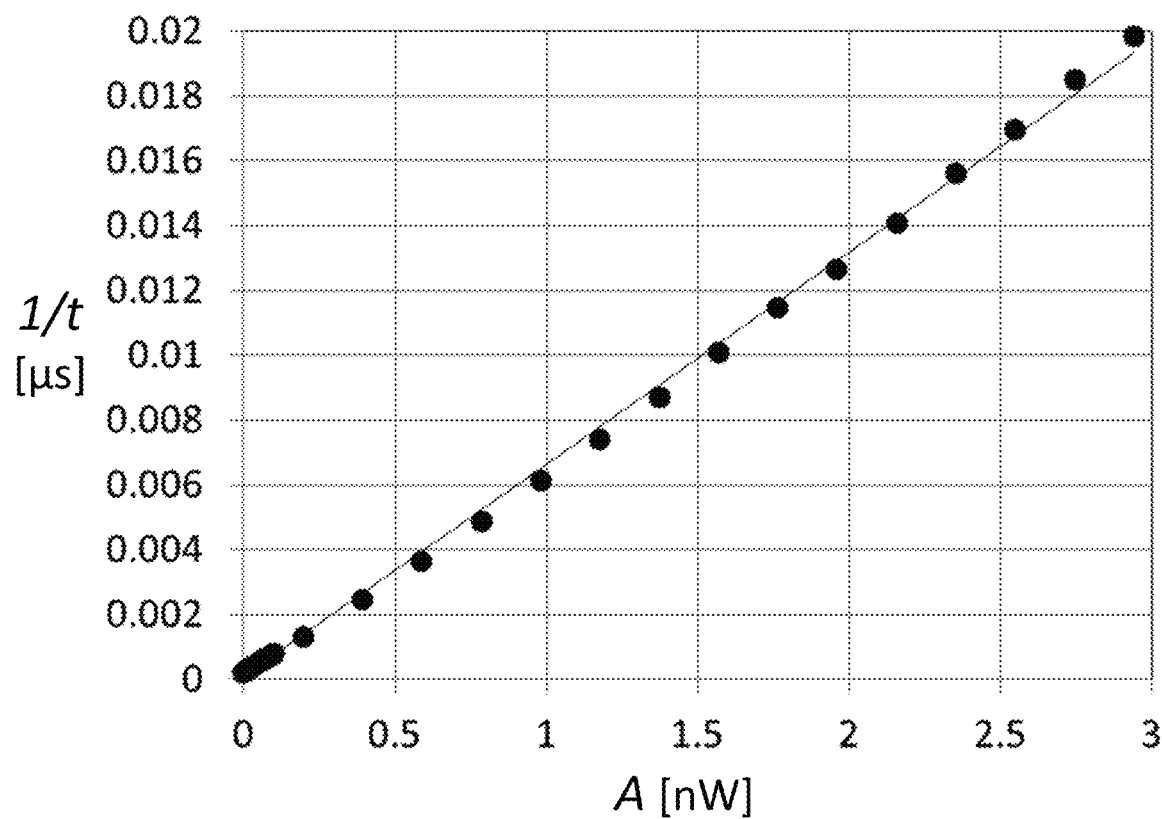
FIG. 7 is a graph plotting reciprocal triggering time, 1/t, as a function of absorbed light power, A.

FIG. 7 is a graph plotting reciprocal triggering time, 1/t, in microseconds as a function of absorbed light power, A, in nanowatts. As can be seen there is a linear relationship between the inverse of triggering time and absorbed light power.

Figure 8:
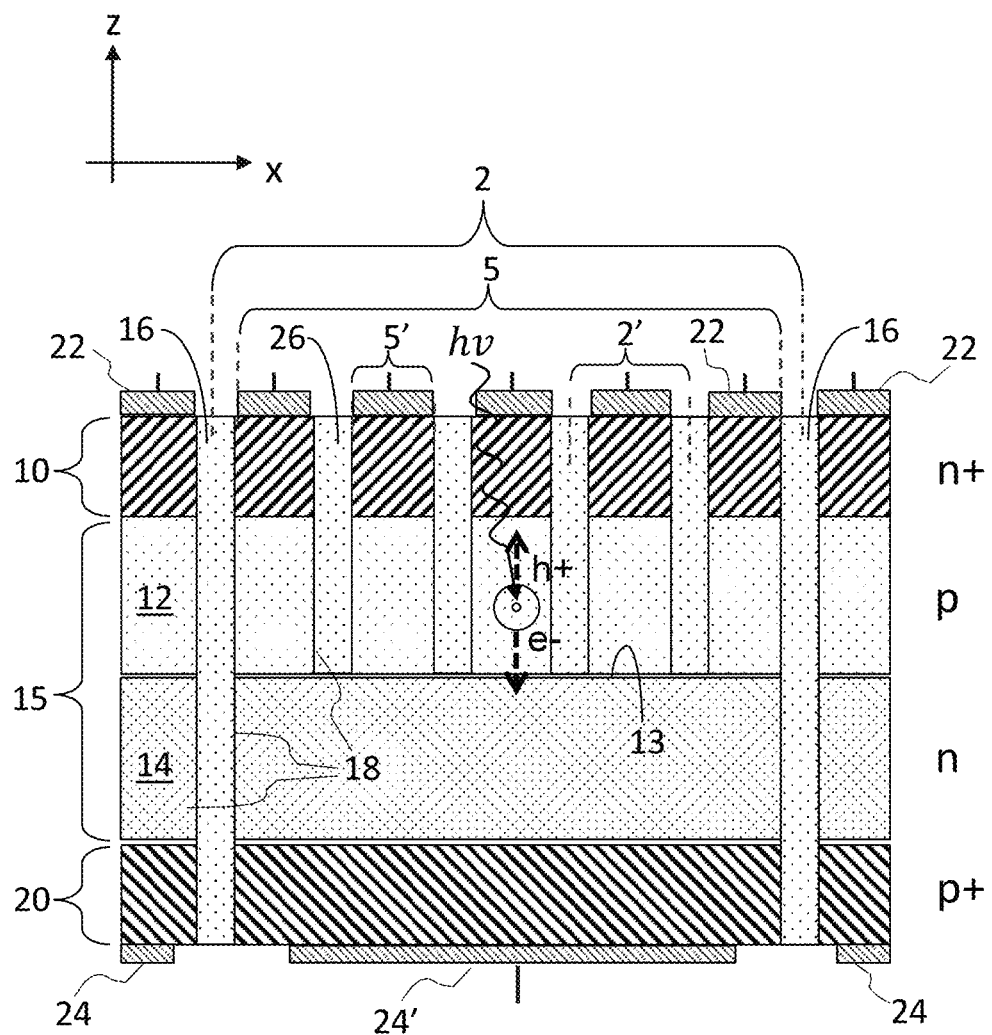
FIG. 8 is a schematic section of a photodetector sensor array according to a variant of the first embodiment.

FIG. 8 is a schematic section of a vertical photodetector array 1 according to a variant of the first embodiment, which will be largely understood from the previous discussion of the first embodiment. In the variant, each pixel 2 consists of a group of subpixels 2'. As in the first embodiment, each pixel 2 is defined by a dielectric material trench 16 extending through the whole structure, i.e. through the n+ p n p+ layers, to define a column 5. The subpixel columns 5' of a given pixel 2 are divided from each other by dielectric material trenches 26, but ones which extend partly, but not wholly, through the structure, namely at least through the upper contact layer 10 (here n+) and at least partway through the upper one of the light absorbing layers 12 (here p) and possibly also partway through the lower one of the light absorbing layers 14 (here n). Each pixel column 5 is thus subdivided into a one- or two-dimensional array of subpixel columns 5' by the further insulating trenches 26 which for each pixel 2 are laterally inside the pixel-defining insulating trenches 16 and which extend vertically through one of the contact regions 10 and at least one of the light absorbing layers 12, 14, but not as far as the other of the contact regions 20, so that the subpixel columns 5' of any one pixel 2 remain commonly contacted by a common lower contact 24', whereas the subpixel columns 5' are individually contacted by respective upper contacts 22. The subpixel structure may serve to reduce internal capacitance and thereby provide better sensitivity. With this subpixel structure, the trenches 26 terminate vertically above the lower contact layer 20, whereas the trenches 16 extend vertically completely through the doped light absorbing layers 12, 14 and optionally also the lower contact layer 20, so that an array of pixel groups is formed with each pixel group having its own lower contact 24' which is common to the subpixels 2' of that group. It will be understood that similar variants of the further embodiments described in the following will also exist, i.e. variants which subdivide each pixel into multiple subpixels.

Figure 9:
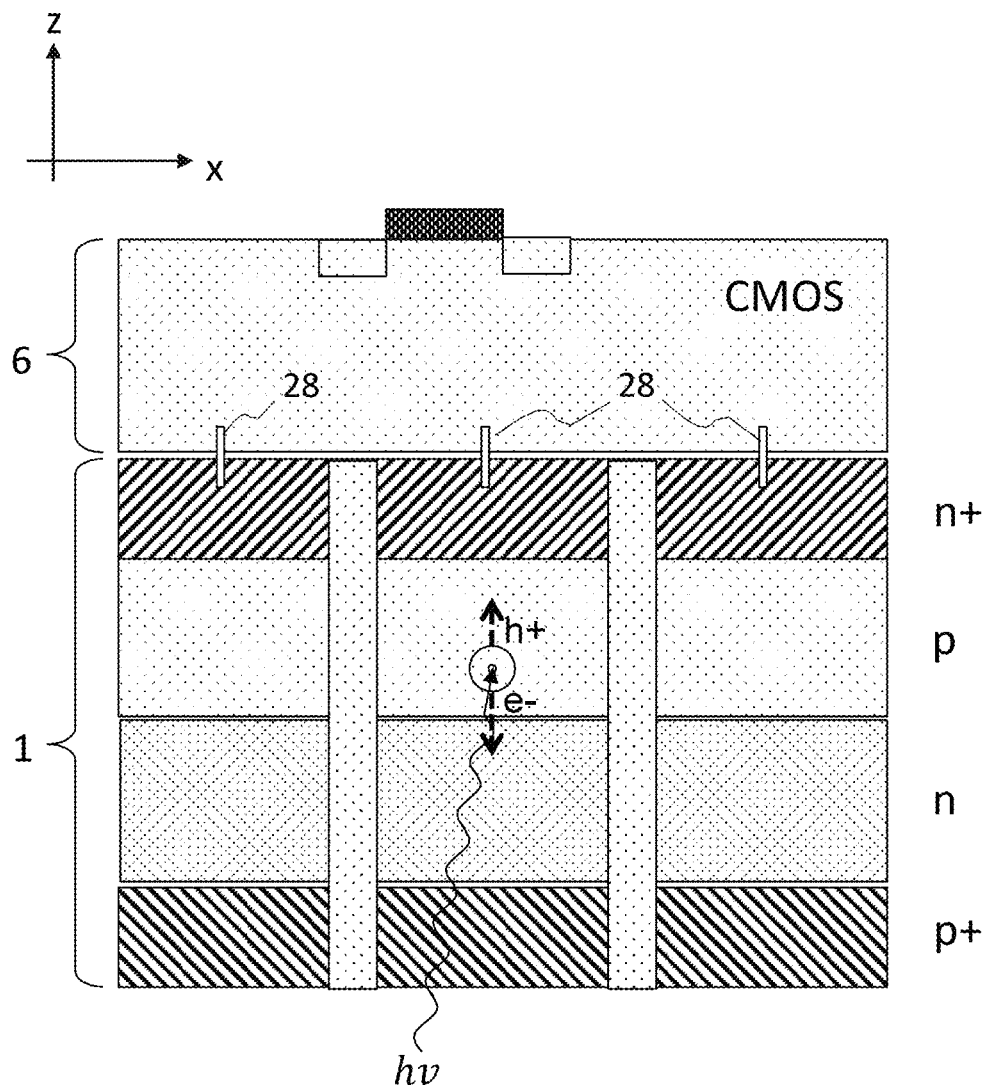
FIG. 9 is a schematic section of an integrated sensor array module incorporating a sensor array device embodying the invention, such as that of the first embodiment.

FIG. 9 is a schematic section of an integrated sensor array module incorporating a sensor array device embodying the invention, such as that of the first embodiment or any of the embodiments described below. The photodetector sensor array device 1 shown in FIG. 3A as one chip is combined with a processor chip formed from a semiconductor circuit layer wafer structure 6 arranged on the upper contact region. The circuit layer of the processor chip comprises an array of read out sensors for the photodetector's pixel array with the sensor-to-pixel connections being implemented with vias 28. In particular, the circuit layer may be CMOS circuit layer which makes it electrical connections to the pixels with through-silicon vias (TSVs) 28. Bias voltages can then be applied to the n+ and p+ contact regions through the TSVs. Moreover, signal current induced by incident light can be detected on a per pixel basis through the TSV connections. The CMOS circuit layer is shown arranged on the n+ contact layer, but alternatively it could be arranged on the p+ contact layer.

Figure 10:
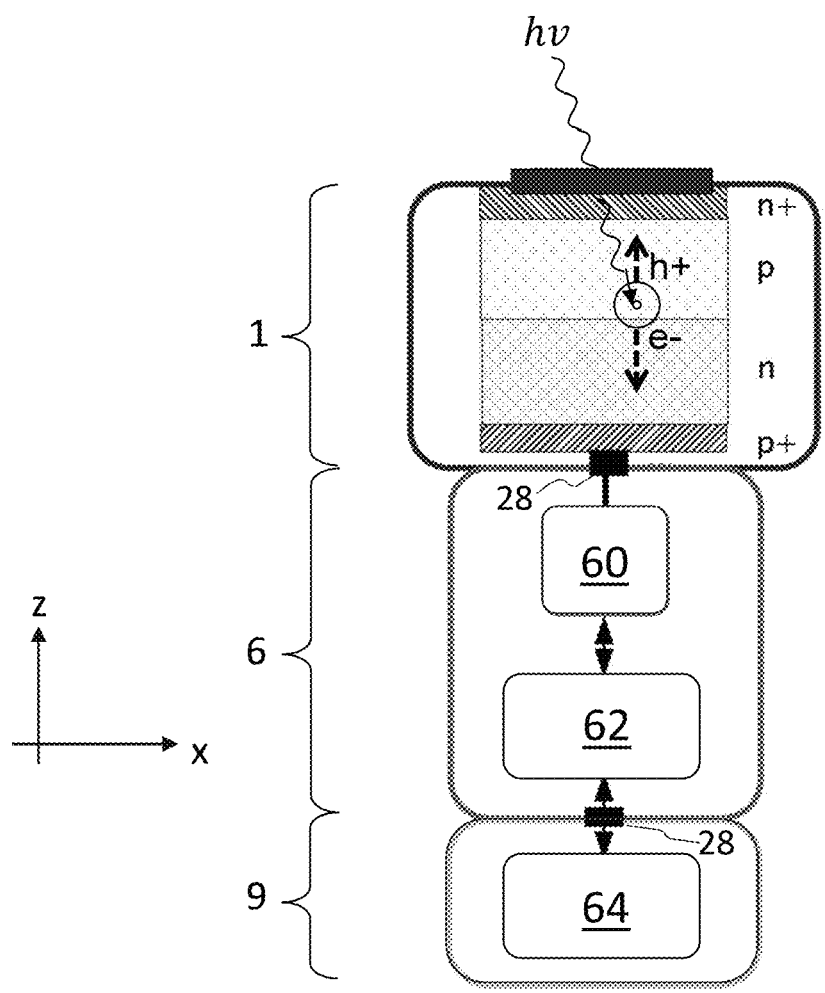
FIG. 10 is a schematic section of another integrated sensor array module incorporating a sensor array device embodying the invention, such as that of the first embodiment.

FIG. 10 is a schematic section of another integrated sensor array module incorporating a sensor array device embodying the invention as one chip, such as the sensor array of the first embodiment or any of the embodiments described below. The integrated sensor array module comprises a sensor array device as shown in FIG. 3A formed as a first chip 1 and an electronics processing device formed as a second chip 6. The processor chip 6 has respective electronic processing elements for the pixels of the sensor array device 1, such as digital front-end circuitry 60 and time-to-digital converter (TDC) elements 62 and optionally also some pixel-specific digital signal processing elements, such as integrators or counters. The processor chip 6 is mounted on the sensor chip 1 so that vias 28 form electrical interconnects between the processing elements of the processor chip and contacts of the respective pixels in the sensor chip 1. The module optionally further comprises a memory device 64 formed as a third chip 9. The memory may be random access memory, such as DRAM. The memory chip comprises memory elements, such as DRAM memory elements 64, for the pixels of the sensor array. The memory chip 9 is mounted on the processor chip 6 so that further vias 28 form electrical interconnects between the processing elements of the processor chip 6 and the respective memory elements of the memory chip 9. A memory chip could also be added to the embodiment of FIG. 9.

Comparing FIG. 9 with FIG. 10 it is noted that the processor chip 6 is on the top of the sensor chip 1 in FIG. 9 (implying bottom illumination of the sensor array) whereas in FIG. 10 the processor chip 6 is underneath the sensor chip 1 (implying top illumination of the sensor array). This difference is representative of the fact that either option is possible. As shown in FIGS. 9 and 10, it is possible to integrate multiple dedicated chips each made by fabrication processes in materials optimized for their own respective designs. Namely, the sensor chips 1 can be fabricated on one wafer using a dedicated optimized process, the electronic circuits for signal processing can be fabricated in another wafer to manufacture numeric processing chips 6 based, for example, on high-performance CMOS processes, and a third wafer can be used to manufacture memory chips 9 using, for example, a dedicated DRAM fabrication process.

Figure 11:
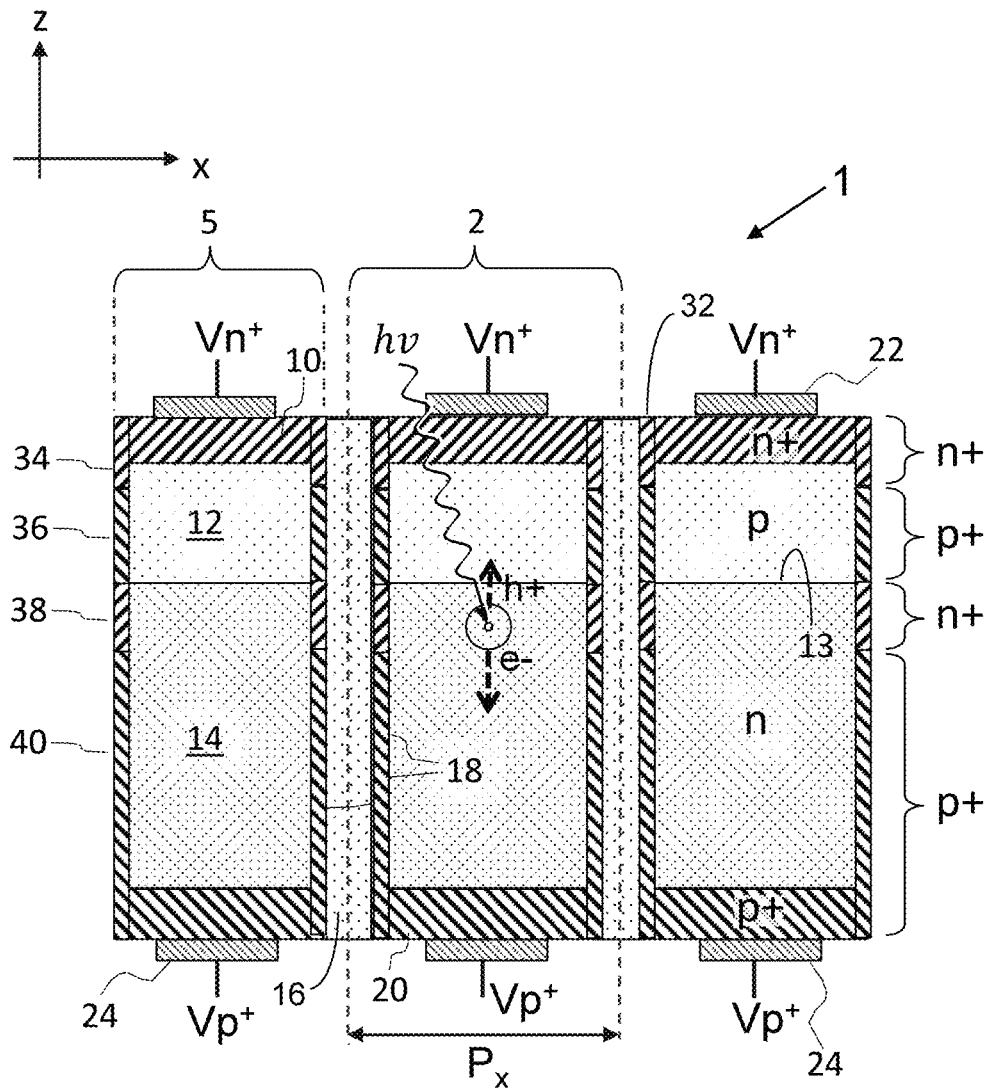
FIG. 11 is a schematic cross-section in the xz-plane of three sensing pixels of a sensor array device according to a second embodiment.

FIG. 11 is a schematic cross-section in the xz-plane of three sensing pixels 2 of a sensor array device 1 according to a second embodiment. The pixel column sidewalls 18 have a highly doped cladding 32 which is formed of four different vertical portions 34, 36, 38, 40 which are respectively doped n+ p+ n+ and p+. The upper and lower contact layers 10 and 20 are thus electrically separated from each other by the cladding portions. The uppermost cladding portion 34 is doped with a dopant of the same doping type as that of the upper contact layer 10 so the highly doped cladding forms an electrical extension of the upper contact layer 10 around the cap of the pixel columns 5. The uppermost portion 34 terminates partway down the p-type upper light absorption layer 12. The lowermost cladding portion 40 is doped with a dopant of the same doping type as that of the lower contact layer 20 so that the highly doped cladding forms an electrical extension of the lower contact layer 20 around the base of the pixel columns 5. The lowermost portion 40 terminates partway up the n-type lower light absorption layer 14. In between the portions 34 and 40 there is arranged additional portions 36 and 38. The lower part of the p-type layer 12 is wrapped with the p+ clad 36 and the upper part of the n-type layer 14 is wrapped with the n+ clad 38. In a variant, the cladding portions 36 and 38 could be omitted and the cladding portions 34 and 40 could extend to meet at the pn-junction 13. The functional aspects of operating the device according to this embodiment are the same as described in relation to FIG. 4A to FIG. 7 above.

Figure 12:
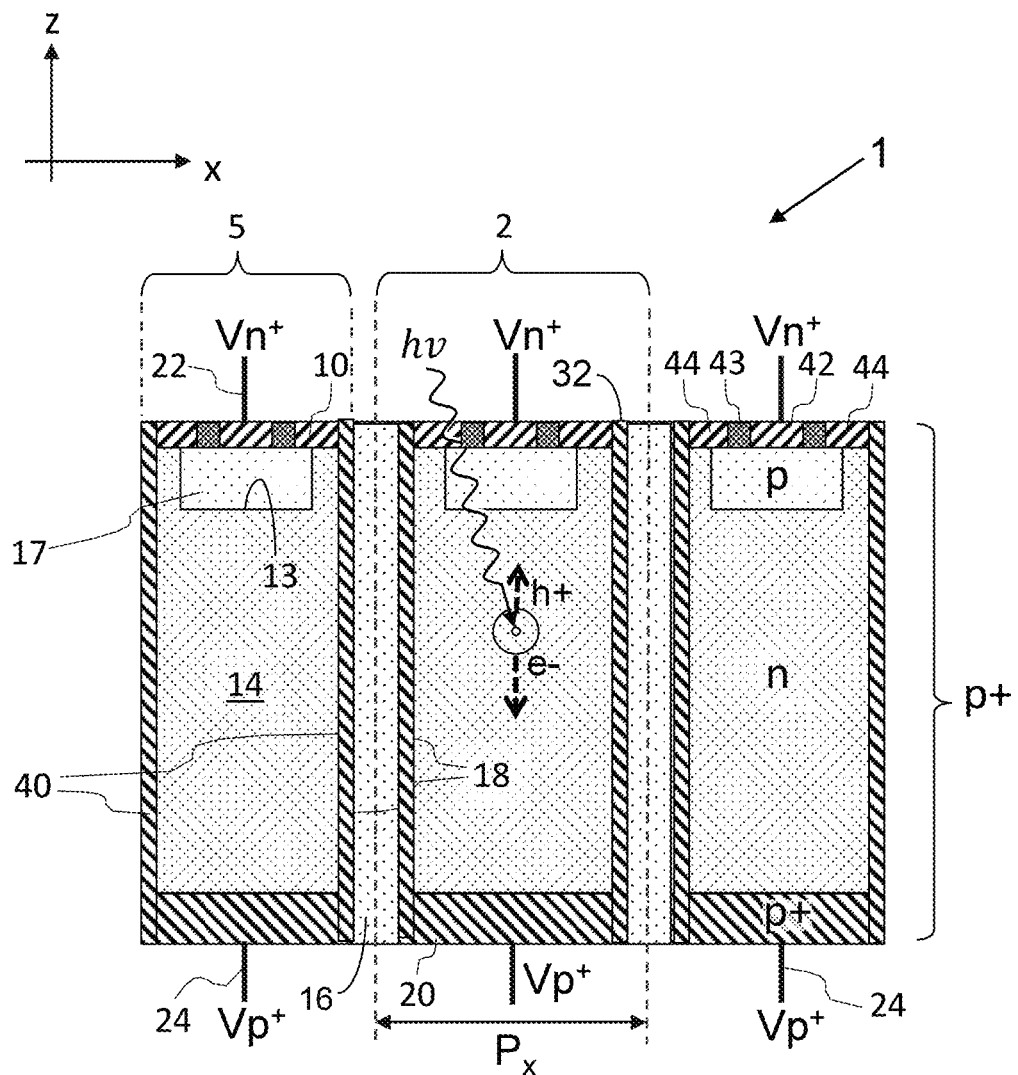
FIG. 12 is a schematic cross-section in the xz-plane of three sensing pixels of a sensor array device according to a third embodiment.

FIG. 12 is a schematic cross-section in the xz-plane of three sensing pixels 2 of a sensor array device 1 according to a third embodiment. In this embodiment, the upper contact 22 is connected to an inner part 42 of the upper contact layer 10 which is electrically isolated from an outer part 44 thereof by a ring of dielectric material 43. The light absorbing region 15 is formed of single layer 14 of n-type semiconductor material which extends vertically all the way between the upper and lower contact layers 10 and 20. Proximal the inner part 42 of the upper contact layer 10, there is disposed a region 17 of p-type semiconductor material which is laterally enclosed in each pixel column 5 by the p-type layer 14 such that the lateral boundary of the region 17, i.e. the pn-junction 13, terminates at the outer part 44 of the upper contact layer 10. The p-type region 17 is thus embedded within the epitaxial layer 14 that forms the n-type part of the light absorbing region. As regards the sidewall doped cladding 32 in this embodiment, which is labeled 40, it is formed by a single dopant of the same doping type as that of the lower contact layer 20, in the illustrated example p+, so the doped cladding 40 on the sidewalls 18 forms an electrical extension of the lower contact layer 20 around the full height of the pixel columns 5. The functional aspects of operating the device according to this embodiment are the same as described in relation to FIG. 4A to FIG. 7 above.

Figure 13:
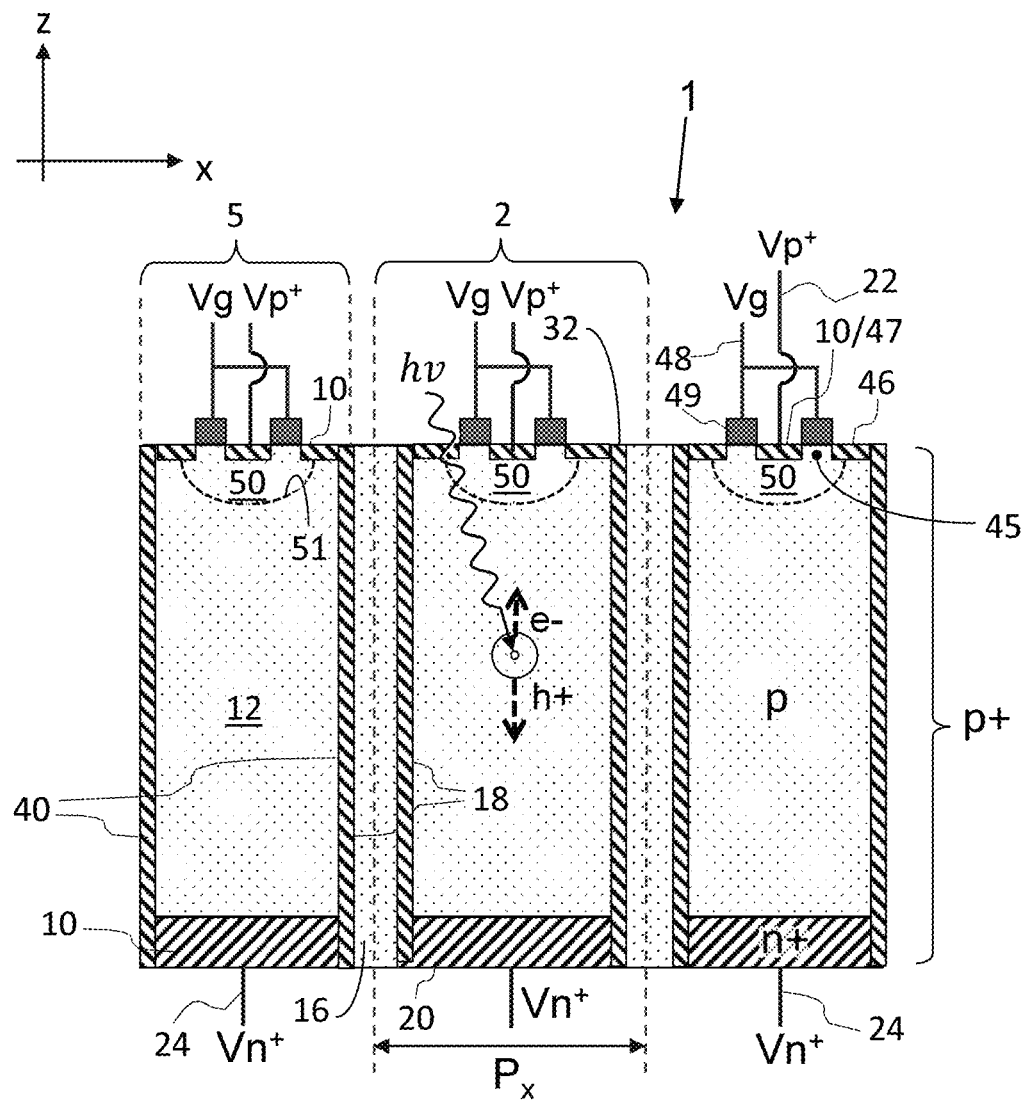
FIG. 13 is a schematic cross-section in the xz-plane of three sensing pixels of a sensor array device according to a fourth embodiment.

FIG. 13 is a schematic cross-section in the xz-plane of three sensing pixels of a sensor array device according to a fourth embodiment. In this embodiment, the stack is inverted compared with the previous embodiments in that the top contact layer 10 is doped p+ and the bottom contact layer 20 is doped n+. Moreover, the light absorbing region is formed of a single layer 12 of p-type semiconductor material that extends between the upper and lower contact layers 10 and 20. When the device is reset by applying a reverse bias, i.e. the bottom contact 24 is held at a greater voltage than the top contact 22, a depletion region 50 with boundary 51 is created in the p-type light absorbing layer 12 adjacent the p-type contact layer. When the device is then switched to a forward bias for sensing, i.e. the bottom contact 24 is held at a lower voltage than the top contact 22, the depletion region 50 acts as a charge sink for capturing holes that have migrated towards the p+ contact. Namely, holes generated in the light absorbing layer in response to photon absorption initially accumulate in the depletion region, gradually eroding it. As the charge sinking effect of the depletion region 50 approaches saturation, i.e. as the depletion region gradually disappears, current starts to flow between the contacts 22, 24. The effect of establishing the depletion region 50 prior to switching to forward bias is that the onset of current flow is delayed by an amount of time from the RB-to-FB switching event which is inversely proportional to the incident light intensity. The same operating principle as in the previous embodiments is thus achieved, but with a different layer structure.

Moreover, in this embodiment, the upper contact 22 is connected to an inner part 47 of the upper contact layer 10 which is separated from an outer part 46 of the upper contact layer 10 by a vertical extension 45 of the p-type light absorbing layer 12 which thus has a closed ring shape in the xy-plane. The ring extension 45 has arranged thereon a gate 49 of the same ring shape which is connected to a gate contact 48. The gate 49 may be a CMOS gate and during fabrication can be used to create a shadow for doping the top contact layer 10 with its p+ dopant. The gate contact 49 may be commonly driven, e.g. connected together with, the top contact 22, or may be kept separately connected as illustrated which provides more flexibility for tailoring the shape of the depletion region during operation by applying different voltages to the contacts 22 and 49, so that the number of carriers that need to accumulate after switching to forward bias before the device switches from its non-conducting to its conducting state can be adjusted. Each pixel within its upper contact layer 10 thus each has a portion 47 connected to the upper contact 22 which is separated from surrounding portions 46 of the upper contact layer 10 by a closed loop 45 of the doped semiconductor material of the light absorbing layer 14. As regards the sidewall doped cladding 32 in this embodiment, which is labeled 40, it is formed by a single dopant of the same doping type as that of the lower contact layer 20, in the illustrated example p+, so the doped cladding 40 on the sidewalls 18 forms an electrical extension of the lower contact layer 20 around the full height of the pixel columns 5. The functional aspects of operating the device according to this embodiment are the same as described in relation to FIG. 4A to FIG. 7 above.

Figure 14A:
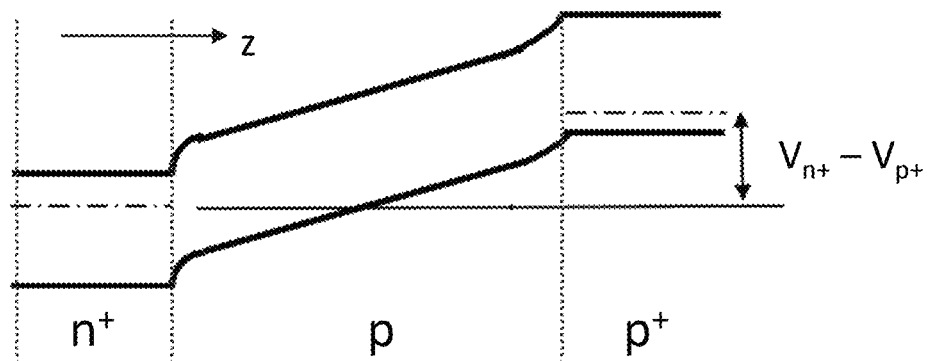
FIGS. 14A, 14B, and 14C are energy band diagrams showing a photodetector pixel according to the embodiment of FIG. 13 with the photodetector pixel respectively in a reversed-biased state, in a forward-biased non-conducting state and in a forward-biased conducting state.
Figure 14B:
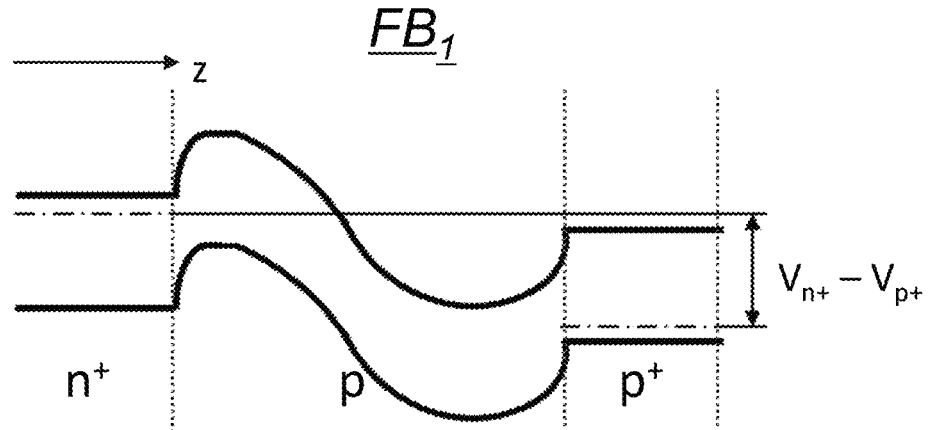
Figure 14C:
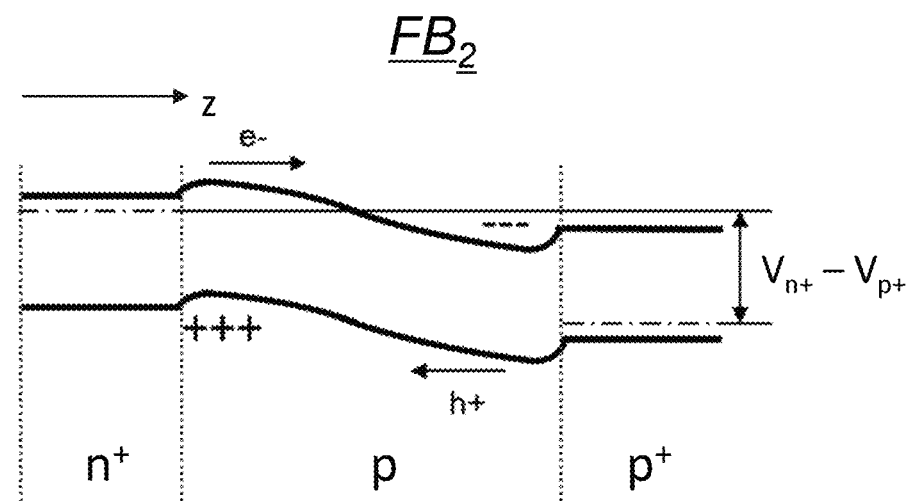

FIGS. 14A, 14B, and 14C are energy band diagrams showing a photodetector according to the embodiment of FIG. 13 with the photodetector respectively in a reversed-biased state (FIG. 14A), in a forward-biased non-conducting state (FIG. 14B) and in a forward-biased conducting state (FIG. 14C). A reset in RB, i.e. the state shown in FIG. 14A can be produced, by way of example, by setting:

$Vp^+=Vg=0V$ and $Vn^+=Vdd/2$ where Vdd is the supply voltage. The FB sensing mode of FIGS. 14B and 14C can be produced, by way of example, by setting:

$Vp^+=Vg=Vdd$ and $Vn^+=Vdd/2$

Figure 15:
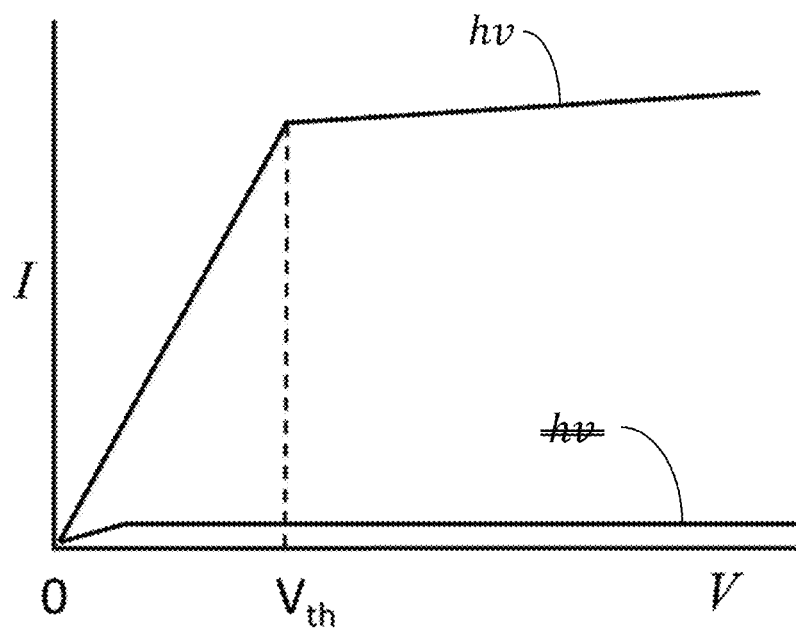
FIG. 15 is a graph of output current as a function of bias voltage for the photodetector according to the embodiment of FIG. 13 with and without incident light, i.e. the forward-biased conducting and non-conducting states of FIGS. 14C and 14B respectively.

FIG. 15 is a graph of output current as a function of bias voltage for the photodetector according to the embodiment of FIG. 13 with and without incident light, i.e. the forward-biased conducting and non-conducting states of FIGS. 14C and 14B respectively.

Figure 16:
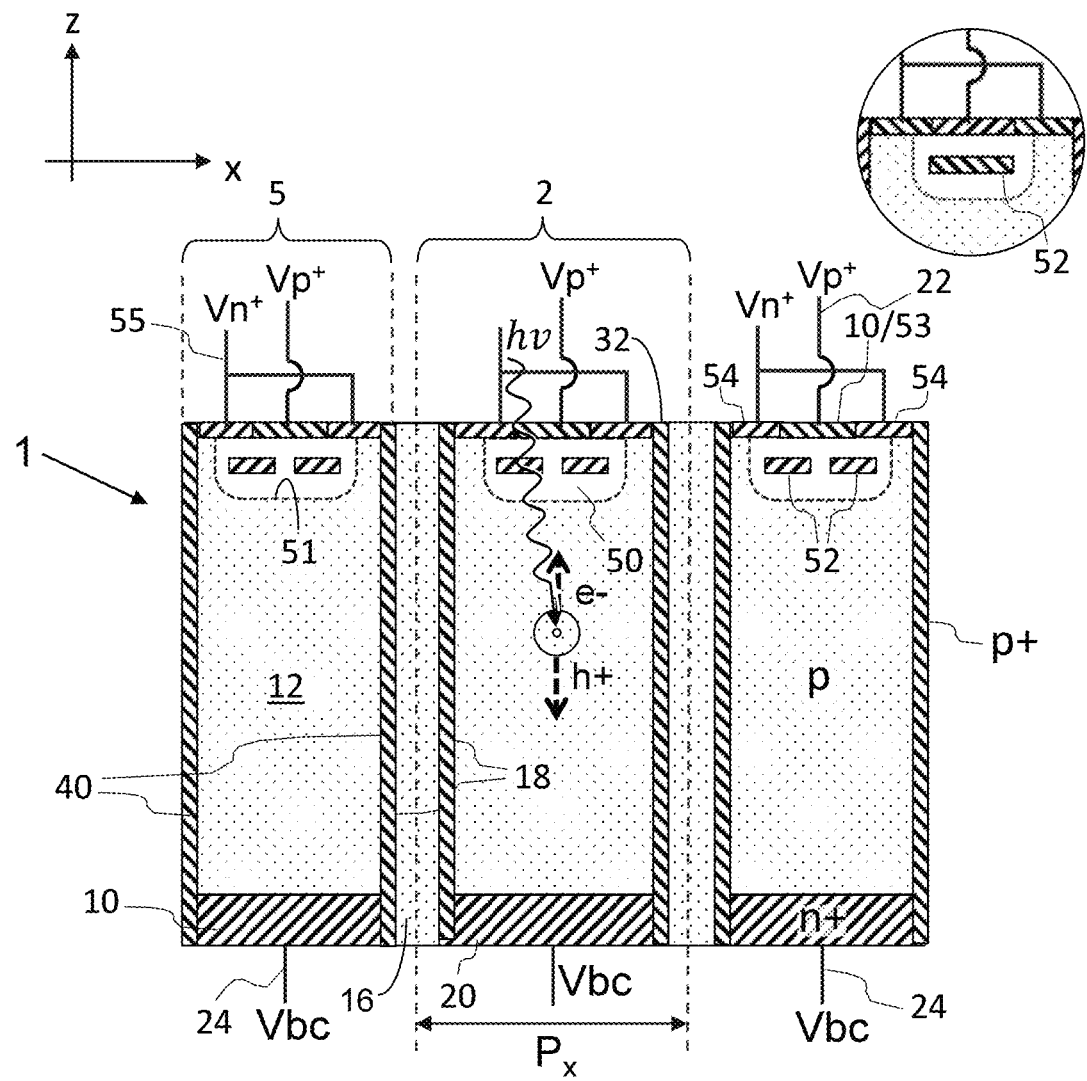
FIG. 16 is a schematic cross-section in the xz-plane of three sensing pixels of a sensor array device according to a fifth embodiment.

FIG. 16 is a schematic cross-section in the xz-plane of three sensing pixels of a sensor array device according to a fifth embodiment. The upper contact 22, which has a voltage labeled as Vp+, is connected to an inner part 53 of the upper contact layer 10 that is doped p+. An outer part 54 of the upper contact layer 10 is oppositely doped, i.e. here n+, to the inner part 53. The outer part 54 is connected to a contact 55 which has a voltage labeled Vn+ applied thereto. The contacts 22 and 55 may be commonly driven or driven with different voltages, thereby providing flexibility for tailoring the shape of the depletion region 50, i.e. the position of its boundary 51, by applying different voltages to the contacts 22 and 55, so that the number of carriers that need to accumulate after switching to forward bias before the device switches from its non-conducting to its conducting state can be adjusted. In this embodiment, each pixel further comprises at least one island 52 of doped semiconductor material that is oppositely doped to the semiconductor material of the doped light absorbing layer within which it is contained (in the illustrated example there are two islands per pixel and they are doped n+). The islands provide a charge sink within the depletion region 50, the latter being formed when a reverse bias voltage is applied between the upper and lower contacts 10, 20. Each pixel thus has a portion 53 within their upper contact layer 10 connected to the upper contact 22 which is separated from surrounding portions 54 of the upper contact layer 10 by a closed loop 54 of highly doped semiconductor material of opposite dopant type, wherein the closed loop 54 has its own contact 55, and wherein the island(s) are proximal said portion of the upper contact layer connected to the upper contact. In a variant, which is shown by the circular inset, a single island 52 may be used which is placed in the same xy-plane as in the main illustration. Further variants may use more than two co-planar islands. Still further variants may have multiple islands that are vertically offset and so lying in different xy-planes. As regards the sidewall doped cladding 32 in this embodiment, which is labeled 40, it is formed by a single dopant of the opposite doping type as that of the lower contact layer 20, in the illustrated example p+. The functional aspects of operating the device according to this embodiment are the same as described in relation to FIG. 4A to FIG. 7 above.

Figure 17A:
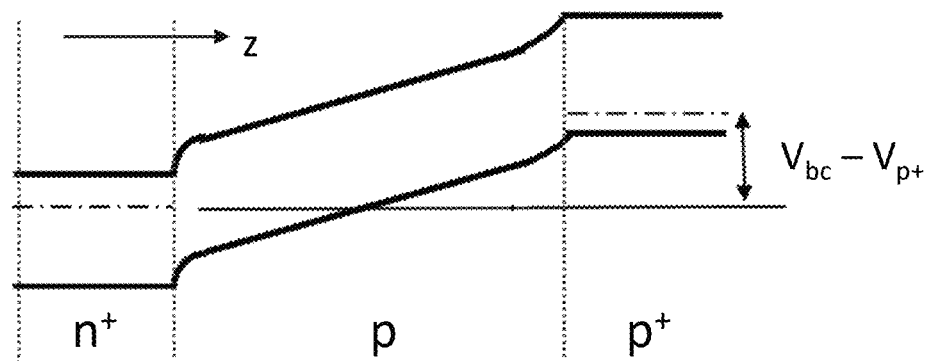
FIGS. 17A, 17B, and 17C are energy band diagrams showing a photodetector according to the embodiment of FIG. 16 with the photodetector pixel respectively in a reversed-biased state, in a forward-biased non-conducting state and in a forward-biased conducting state.
Figure 17B:
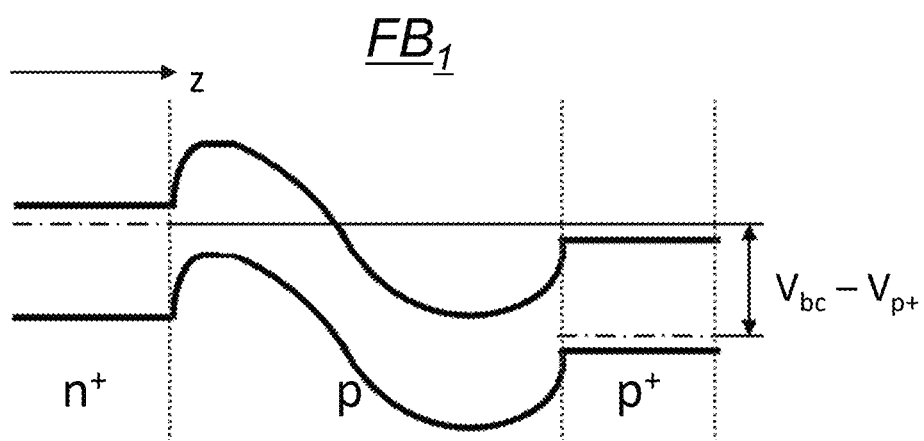
Figure 17C:
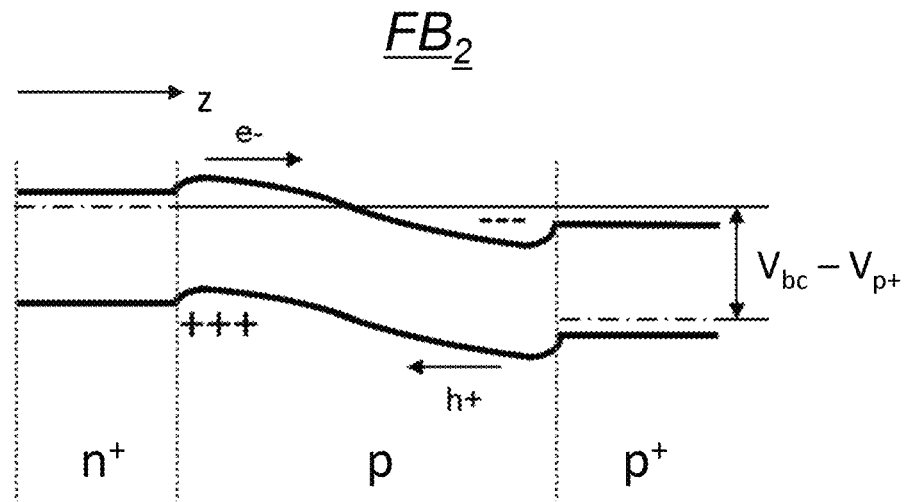

FIGS. 17A, 17B, and 17C are energy band diagrams showing a photodetector according to the embodiment of FIG. 16 with the photodetector respectively in a reversed-biased state, in a forward-biased conducting state and a forward-biased non-conducting state. A reset in RB, i.e. the state shown in FIG. 17A can be produced, by way of example, by setting:

$Vp^+=Vn^+=0V$ and $Vbc=Vdd/2$ where the FB sensing mode of FIGS. 17B and 17C can be produced, by way of example, by setting:

$Vp^+=Vn^+=Vdd$ and $Vbc=Vdd/2$

Figure 18:
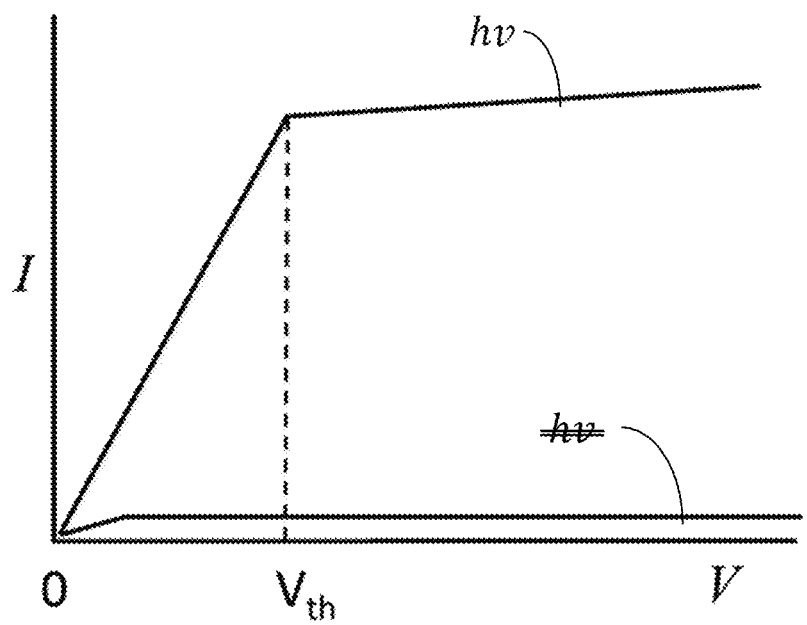
FIG. 18 is a graph of output current as a function of bias voltage for the photodetector according to the embodiment of FIG. 16 with and without incident light, i.e. the forward-biased conducting and non-conducting states of FIGS. 17C and 17B respectively.

FIG. 18 is a graph of output current as a function of bias voltage for the photodetector according to the embodiment of FIG. 16 with and without incident light, i.e. the forward-biased conducting and non-conducting states of FIGS. 17C and 17B respectively.

It should be noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present embodiments are also directed to such representation of the circuitry described herein, and/or techniques implemented thereby, and, as such, are intended to fall within the scope of the present embodiments.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the circuitry of the present embodiments, including the photodetector and/or techniques implemented thereby, may be implemented by a computer system wherein characteristics and operations of such circuitry, and techniques implemented thereby, are simulated, imitated, replicated, analyzed and/or predicted via a computer system. The present embodiments are also directed to such simulations and testing of the inventive device and/or circuitry, and/or techniques implemented thereby, and, as such, are intended to fall within the scope of the present embodiments. The computer-readable media and data corresponding to such simulations and/or testing tools are also intended to fall within the scope of the present embodiments.

In summary, in the above detailed description we have described a photodetector sensor array device suitable for use as a camera chip which has a structure comprising upper and lower contact layers of n+ and p+ semiconductor material either side of a light absorbing region. The light absorbing region is made of either one layer of doped semiconductor material (p or n), or two oppositely doped layers of semiconductor material (to form a pn-junction). The array of pixels is formed by etching trenches through at least a part of the layers, the trenches then being filled with dielectric material, optionally after first doping the sidewalls of the pixel columns to passivate surface defects at or close to the sidewalls. Upper and lower contacts are connected to the upper and lower contact layers so that a suitable voltage can be applied to the pixels in operation. In each operating cycle, the device is first reset with a reverse bias, and then switched to forward bias for sensing. After switching to forward bias, carriers which are generated in the light absorbing region in response to photon absorption accumulate in the potential wells. The carriers do not immediately cause a current to flow between the contacts, since the carriers are first required to accumulate in order to reduce the potential barrier(s) between the light absorbing region and the contact(s). Then, after a time delay characteristic of the potential barrier, current will start to flow, where the time delay is inversely proportional to, and hence a measure of, the incident light intensity.

It will be clear to one skilled in the art that many improvements and modifications can be made to the foregoing exemplary embodiment without departing from the scope of the present disclosure.

REFERENCE NUMERALS

Reference Numeral Item
1 sensor array (chip/device)
2 pixel
2' subpixel
3 silicon-on-insulator wafer substrate
4 insulator for gate
5 pixel column/photodetector
5' subpixel column
6 CMOS electronics chip
7 silicon wafer
8 insulator layer
9 DRAM memory chip
10 upper highly doped contact layer (n+)
12 upper portion of light absorbing layer (p)
13 pn-junction
14 lower portion of light absorbing layer (n)
15 light absorbing layer
16 dielectric trench (inter-pixel)
17 upper region of light absorbing layer (p)
18 column sidewall
20 lower highly doped contact layer (p+)
22 upper contact
24 lower contact
24' common lower contact for subpixel group 25 control circuitry/electronics
26 dielectric trench (intra-pixel)
28 via
30 optical fiber
32 sidewall doped cladding
34 sidewall cladding forming an electrical extension of the upper contact layer 10
36 intermediate sidewall cladding
38 intermediate sidewall cladding
40 sidewall cladding forming an electrical extension of the lower contact layer 20
42 inner part of layer 10 connected to contact 22
43 dielectric ring around 42 in layer 10
44 outer part of layer 10 isolated from contact 22
45 closed loop ring at top of light absorbing layer
46 outer part of layer 10 separate from contact 24
47 inner part of layer 10 connected to contact 24
48 gate contact
49 gate (ring-shaped)
50 transient depletion region adjacent layer 10
51 boundary of depletion region 50
52 island in light absorbing layer 12
53 inner part of layer 10 connected to contact 22
54 outer part of layer 10 connected to contact 55
55 contact to 54
60 digital front-end circuitry
62 time-to-digital converter (TDC) and digital signal processor
64 DRAM memory

What is claimed is:

1. A sensor array device with an array of sensing pixels, the device comprising:
an upper contact layer composed of a highly doped p-type or n-type semiconductor material;
a lower contact layer composed of a highly doped n-type or p-type semiconductor material of opposite type to the upper contact layer;
a light absorbing layer of doped semiconductor material sandwiched between the upper and lower contact layers, the light absorbing layer being configured to generate pairs of oppositely charged carriers in response to absorption of photons when light is incident on the device;
a mesh of insulating trenches of dielectric material extending vertically through the upper contact layer and at least a proportion of the doped light absorbing layer to subdivide the layers into an array of laterally adjacent, independently contactable columns of semiconductor material that form the pixels; and
upper and lower contacts connected to respective pixels of the upper and lower contact layers so that, after a voltage applied between the upper and lower contacts of a pixel is switched from a reverse bias to a forward bias, carriers which are generated in the light absorbing layer in response to photon absorption accumulate in the light absorbing layer, which causes current to start to flow between the upper and lower contacts after a time delay which is inversely proportional to the incident light intensity.

2. The device of claim 1, wherein the pixel-forming columns have an aspect ratio of less than unity as defined by the depth of the light absorbing layer being greater than the lateral separation between adjacent pixels.

3. The device of claim 1, wherein the doped light absorbing layer is subdivided into oppositely doped upper and lower layers of semiconductor material which are arranged together with the oppositely doped upper and lower contact layers in a vertical doping sequence of n+ p n p+.

4. The device of claim 1, wherein the doped light absorbing layer extends with a single type of doping between the upper and lower contact layers and is configured so that, in each pixel,
when a reverse bias voltage is applied between the upper and lower contacts a charge sink is created in the doped light absorbing layer adjacent one of the contacts, and,
when the voltage is switched from reverse bias to forward bias, carriers generated in the light absorbing layer in response to photon absorption initially accumulate at the charge sink and then, after the charge sink approaches saturation, current starts to flow between the contacts, the onset of current flow occurring after a time delay from the switching which is inversely proportional to the incident light intensity.

5. The device of claim 4, wherein the pixels within their upper contact layer each have a portion connected to the upper contact which is separated from surrounding portions of the upper contact layer by a closed loop of the doped semiconductor material of the light absorbing layer, so that the charge sink is provided by a depletion region which is formed around the portion of the upper contact layer that is connected to the upper contact when a reverse bias voltage is applied between the upper and lower contacts.

6. The device of claim 4, each pixel further comprising at least one island of doped semiconductor material that is oppositely doped to the semiconductor material of the doped light absorbing layer within which it is contained, so that the charge sink is provided by forming a depletion region at the island(s) when a reverse bias voltage is applied between the upper and lower contacts.

7. The device of claim 6, wherein the pixels within their upper contact layer each have a portion connected to the upper contact which is separated from surrounding portions of the upper contact layer by a closed loop of highly doped semiconductor material of opposite dopant type, wherein the closed loop has its own contact, and wherein the island(s) are proximal said portion of the upper contact layer that is connected to the upper contact.

8. The device of claim 1, wherein the pixel-forming columns have sidewalls adjacent the dielectric material of the trenches, the sidewalls having a highly doped cladding over at least a portion of their vertical extent.

9. The device of claim 8, wherein at least a lower portion of the sidewalls has a highly doped cladding with a dopant of the same doping type as that of the lower contact layer so that the highly doped cladding forms an electrical extension of the lower contact layer around the columns.

10. The device of claim 8, wherein at least an upper portion of the sidewalls has a highly doped cladding with a dopant of the same doping type as that of the upper contact layer so the highly doped cladding forms an electrical extension of the upper contact layer around the columns.

11. The device of claim 10, wherein the lower and upper contact layers are electrically separated from each other by first and second highly doped sidewall cladding portions such that the lower and upper contact layers and the interposed highly doped sidewall cladding portions are in a vertical doping sequence of p+ n+ p+ n+.

12. The device of claim 1, wherein the dielectric trenches terminate vertically above the lower contact layer and wherein the lower contact is a blanket contact for the array.

13. The device of claim 1, wherein the dielectric trenches further extend vertically completely through the doped light absorbing layer and also through the lower contact layer, and wherein the lower contact comprises an array of contacts connected to respective pixels of the lower contact layer.

14. The device of claim 1, wherein some of the dielectric trenches terminate vertically above the lower contact layer whereas others extend vertically completely through the doped light absorbing layer and the lower contact layer, so that an array of pixel groups is formed with each pixel group having its own lower contact which is common to the pixels of that group.

15. An integrated sensor array module comprising:
the sensor array device of claim 1 formed as a first chip from a first wafer; and
a processor device formed as a second chip from a second wafer,
wherein the processor chip comprises an array of pixel-specific processing elements for the pixels of the sensor chip,
the processor chip being mounted on the sensor chip so that vias form electrical connections between each of the pixel-specific processing elements of the processor chip and pixel contacts of corresponding pixels in the sensor array device.

16. The integrated sensor array module of claim 15, further comprising:
a memory device formed as a third chip from a third wafer, the memory chip comprising pixel-specific memory elements for the pixels of the sensor chip,
the memory chip being mounted on the processor chip so that further vias form electrical connections between each of the pixel-specific processing elements of the processor chip and the pixel-specific memory elements in the memory chip.

17. A method of manufacturing a photodetector device, the method comprising:
fabricating a semiconductor epitaxial structure comprising: an upper contact layer composed of a highly doped p-type or n-type semiconductor material; a lower contact layer composed of a highly doped n-type or p-type semiconductor material of opposite type to the upper contact layer, and a light absorbing layer of doped semiconductor material sandwiched between the upper and lower contact layers, the light absorbing layer being configured to generate pairs of oppositely charged carriers in response to absorption of photons when light is incident on the device;
etching a mesh of trenches vertically through the upper contact layer and at least a proportion of the doped light absorbing layer to subdivide the layers into an array of laterally adjacent, independently contactable columns of semiconductor material that are to form the pixels;
filling the trenches with dielectric material to make them insulating; and
providing upper and lower contacts to the pixels of the upper and lower contact layers so that, in the photodetector device after a voltage applied between the upper and lower contacts of a pixel is switched from a reverse bias to a forward bias, carriers which are generated in the light absorbing layer in response to photon absorption accumulate in the light absorbing layer, which causes current to start to flow between the upper and lower contacts after a time delay which is inversely proportional to the incident light intensity.

18. A method of operating a photodetector device, the method comprising:
providing a photodetector device with:
an upper contact layer composed of a highly doped p-type or n-type semiconductor material;
a lower contact layer composed of a highly doped n-type or p-type semiconductor material of opposite type to the upper contact layer;
a light absorbing layer of doped semiconductor material sandwiched between the upper and lower contact layers, the light absorbing layer being configured to generate pairs of oppositely charged carriers in response to absorption of photons when light is incident on the device;
a mesh of insulating trenches of dielectric material extending vertically through the upper contact layer and at least a proportion of the doped light absorbing layer to subdivide the layers into an array of laterally adjacent, independently contactable columns of semiconductor material that form the pixels; and
upper and lower contacts connected to respective pixels of the upper and lower contact layers;
operating the photodetector device by repeatedly:
applying a reverse bias voltage between the upper and lower contacts;
switching the reverse bias voltage to a forward bias voltage so that carriers which are subsequently generated in the light absorbing layer in response to photon absorption accumulate in the light absorbing layer; and
sensing for onset of current flow between the upper and lower contacts and measuring a time delay between said switching and said onset, wherein the time delay is inversely proportional to the incident light intensity.

* * * * *